(12) United States Patent
Kim et al.

(10) Patent No.: US 8,248,852 B2
(45) Date of Patent: Aug. 21, 2012

(54) NONVOLATILE MEMORY DEVICES OPERABLE USING NEGATIVE BIAS VOLTAGES AND RELATED METHODS OF OPERATION

(75) Inventors: Moosung Kim, Yongin-si (KR); Youngho Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 186 days.

(21) Appl. No.: 12/820,628

(22) Filed: Jun. 22, 2010

(65) Prior Publication Data

US 2011/0096602 A1 Apr. 28, 2011

(30) Foreign Application Priority Data

Oct. 26, 2009 (KR) .................. 10-2009-0101684

(51) Int. Cl.
*G11C 11/34* (2006.01)
(52) U.S. Cl. ......... 365/185.11; 365/185.17; 365/185.18; 365/185.23; 365/185.27; 365/185.33
(58) Field of Classification Search ............. 365/185.11, 365/185.17, 185.18, 185.23, 185.27, 185.33
See application file for complete search history.

(56) References Cited

U.S. PATENT DOCUMENTS

| | | | | |
|---|---|---|---|---|
| 5,847,995 A * | 12/1998 | Kobayashi et al. | ....... | 365/185.11 |
| 5,963,477 A * | 10/1999 | Hung | ...................... | 365/185.11 |
| 5,982,661 A * | 11/1999 | Kawamata | ................ | 365/185.11 |
| 6,215,699 B1 * | 4/2001 | Yamamoto | ................ | 365/185.11 |
| 6,240,032 B1 * | 5/2001 | Fukumoto | ................ | 365/185.11 |
| 6,272,042 B1 * | 8/2001 | Kato et al. | ................ | 365/185.11 |
| 6,285,587 B1 * | 9/2001 | Kwon | ...................... | 365/185.11 |
| 6,353,555 B1 * | 3/2002 | Jeong | ........................ | 365/185.11 |
| 6,643,175 B2 * | 11/2003 | Yamauchi et al. | ........ | 365/185.11 |
| 6,711,058 B1 * | 3/2004 | Hirano | ...................... | 365/185.11 |
| 6,781,915 B2 * | 8/2004 | Arimoto et al. | ........... | 365/185.11 |
| 6,914,815 B2 * | 7/2005 | Kamei et al. | ............. | 365/185.11 |
| 6,930,923 B2 * | 8/2005 | Chen et al. | ............... | 365/185.11 |
| 7,196,932 B2 * | 3/2007 | Takeuchi et al. | .......... | 365/185.11 |
| 7,280,414 B2 | 10/2007 | Kato | | |
| 7,426,141 B2 * | 9/2008 | Takeuchi | .................. | 365/185.11 |
| 7,433,244 B2 * | 10/2008 | Yoon et al. | ............... | 365/185.11 |
| 7,630,242 B2 * | 12/2009 | Taito et al. | ............... | 365/185.11 |
| 7,649,775 B2 * | 1/2010 | Kim et al. | ................ | 365/185.11 |
| 7,672,164 B2 * | 3/2010 | Hasegawa et al. | ........ | 365/185.11 |
| 7,808,829 B2 * | 10/2010 | Lee | ........................... | 365/185.11 |
| 7,869,280 B2 * | 1/2011 | Kosaki et al. | ............. | 365/185.11 |
| 8,107,299 B2 * | 1/2012 | Takahashi | ................. | 365/185.11 |
| 2008/0117691 A1 | 5/2008 | Kawasaki | | |

FOREIGN PATENT DOCUMENTS

| | | |
|---|---|---|
| JP | 2008-146695 | 6/2008 |
| JP | 2008-146800 | 6/2008 |
| KR | 1020070047335 A | 5/2007 |
| KR | 1020080045050 A | 5/2008 |
| KR | 1020080052471 A | 6/2008 |

* cited by examiner

*Primary Examiner* — Trong Phan
(74) *Attorney, Agent, or Firm* — Myers Bigel Sibley & Sajovec, P.A.

(57) ABSTRACT

A nonvolatile memory device includes a first address decoder and a second address decoder. The first address decoder includes a plurality of transistors disposed in a first well, and the second address decoder includes a plurality of transistors disposed in a second well that is electrically isolated from the first well. The first and second address decoders are associated with first and second memory blocks, respectively. A switch circuit is configured to provide a negative voltage to one of the first address decoder and the second address decoder on the basis of block address information that specifies an address included in one of the first memory block and the second memory block. Related methods of operation are also discussed.

18 Claims, 19 Drawing Sheets

Fig. 9

NONVOLATILE MEMORY DEVICES OPERABLE USING NEGATIVE BIAS VOLTAGES AND RELATED METHODS OF OPERATION

CROSS-REFERENCE TO RELATED APPLICATIONS

This U.S. non-provisional patent application claims priority under 35 U.S.C. §119 from Korean Patent Application No. 10-2009-0101684, filed on Oct. 26, 2009, the disclosure of which is hereby incorporated by reference herein in its entirety.

BACKGROUND

The present inventive concept relates to nonvolatile memory devices and related methods of operation.

Semiconductor memory devices are microelectronic devices that may be used in microprocessor-based applications and computers for fields ranging from satellite to consumer electronics. Therefore, advances in memory fabrication technology, including technology development and process improvement obtained through scaling for high speed and high integration density, may influence the performance of other digital logic systems.

Semiconductor memory devices are generally classified into volatile memory devices and nonvolatile memory devices. Nonvolatile memory devices can retain data stored therein even when power supply thereto is interrupted. Data stored in nonvolatile memory devices may be permanent or reprogrammable according to memory fabrication technologies. Nonvolatile memory devices may also be used to store programs and/or microcode in various applications such as computers, avionics, communications, and consumer electronic technologies.

One example of a nonvolatile memory device is a flash memory device. Recently, as the demand for higher integration of memory devices has increased, multi-bit memory devices capable of storing multi-bit data in each memory cell have been pursued.

SUMMARY

Embodiments of the inventive concept provide nonvolatile memory devices capable of reducing the required voltage pumping capacity of a voltage generator and methods for applying a bias voltage thereof.

According to some embodiments of the inventive concept, a nonvolatile memory device includes a first address decoder, a second address decoder, and a switch circuit. The first address decoder includes a plurality of transistors disposed in a first well, and the first address decoder is associated with a first memory block. The second address decoder includes a plurality of transistors disposed in a second well that is electrically isolated from the first well, and the second address decoder is associated with a second memory block. The switch circuit is configured to provide a negative voltage to one of the first address decoder and the second address decoder on the basis of block address information that specifies an address included in one of the first memory block and the second memory block.

In some embodiments, the switch circuit may be configured to provide the negative voltage to one of the first well and the second well based on the address specified by the block address information. The switch circuit may be configured to provide a ground voltage to the second well when the negative voltage is provided to the first well.

In some embodiments, the nonvolatile memory device may further include a negative voltage level generator configured to generate the negative voltage. The one of the first address decoder and the second address decoder may be configured to provide the negative voltage to at least one word line connected to the one of the first and second memory blocks, and the negative voltage level generator may be configured to be enabled when the negative voltage is to be provided to the at least one word line.

In some embodiments, the switch circuit may include a negative voltage line switch circuit configured to connect the negative voltage with one of a first negative voltage line connected to the first well and a second negative voltage line connected to the second well on the basis of the block address information.

In some embodiments, the switch circuit may further include a selection line switch circuit configured to connect a plurality of selection lines to one of first selection lines and second selection lines on the basis of the block address information, where the first selection lines may be connected to the first address decoder and the second selection lines are connected to the second address decoder. The selection line switch circuit may include a plurality of transistors disposed in a well. The selection line switch circuit may be configured to connect the negative voltage to at least one of the plurality of selection lines, and, when the negative voltage is provided to the at least one of the selection lines, the negative voltage may be provided to the well in which the plurality of transistors of the selection line switch circuit is disposed.

In some embodiments, the nonvolatile memory device may further include a memory cell array including the first and second memory blocks. The memory cell array may include a plurality of memory cells disposed between the first address decoder and the second address decoder. The first address decoder may include a first block selector configured to enable the first memory block on the basis of the block address information, and the second address decoder may include a second block selector configured to enable the second memory block on the basis of the block address information. One of the first block selector and the second block selector may be configured to be enabled on the basis of the block address information.

In some embodiments, the first block selector may be configured to receive the negative voltage through a first negative voltage line, and the second block selector may be configured to receive the negative voltage through a second negative voltage line.

In some embodiments, the first block selector may include a first block selection switch configured to drive the first memory block in response to the voltage of a first block word line, a first pull-up circuit configured to provide a high voltage to the first block word line in response to a first enable signal, a first pull-down circuit configured to provide a voltage of the first negative voltage line to the first block word line in response to a complementary signal of the first enable signal, and a first block address decoder configured to receive the block address information and generate the first enable signal in response thereto.

In some embodiments, the second block selector may include a second block selection switch configured to drive the second memory block in response to the voltage of a second block word line, a second pull-up circuit configured to provide a high voltage to the second block word line in response to a second enable signal, a second pull-down circuit configured to provide a voltage of the second negative voltage line to the second block word line in response to a complementary signal of the second enable signal, and a second block address decoder configured to receive the block address information and generate the second enable signal in response thereto.

In some embodiments, the nonvolatile memory device may further include a selection line driver configured to drive the plurality of selection lines with a plurality of bias voltages. The selection line driver may include a plurality of transistors disposed in a well. If at least one of the plurality of bias voltages is the negative voltage, the negative voltage may be provided to the well in which the plurality of transistors of the selection line driver are disposed.

According to further embodiments of the inventive concept, a nonvolatile memory device includes a first matrix of memory cells including a plurality of memory blocks, a second matrix of memory cells comprising a plurality of memory blocks, first and second address decoders associated with the first matrix, third and fourth address decoders associated with the second matrix, and a negative voltage line switch circuit configured to connect a negative voltage to one of the first address decoder and the second address decoder, and to one of the third address decoder and the fourth address decoder, on the basis of block address information.

In some embodiments, in a 2X mode, the block address information may include a first block address corresponding to one of the plurality of memory blocks included in the first matrix, and a second block address corresponding to one of the plurality of memory blocks in the second matrix. The negative voltage line switch circuit may be configured to connect the negative voltage to the one of the first address decoder and the second address decoder associated with the one of the plurality of memory blocks of the first matrix, and to connect the negative voltage to the one of the third address decoder and the fourth address decoder associated with the one of the plurality of memory blocks of the second matrix.

In some embodiments, the nonvolatile memory device may further include a selection line switch circuit configured to connect a plurality of selection lines to one of first selection lines and second selection lines on the basis of the block address information. The first and second address decoders may be disposed on opposite sides of the first matrix, and the third and fourth address decoders may be disposed on opposite sides of the second matrix. The first selection lines may be connected to the first and fourth address decoders, and the second selection lines may be connected to the second and third address decoders.

In some embodiments, the negative voltage line switch may be configured to connect the negative voltage to one of a first negative voltage line that is connected to the first and fourth address decoders, and a second negative voltage line that is connected to the second and third address decoders, on the basis of the block address information.

According to still further embodiments of the inventive concept, a method of operating a nonvolatile memory device including a plurality of address decoders includes generating a negative voltage, providing the negative voltage to at least one word line of a selected memory block via one of the plurality of address decoders associated therewith in response to a block address, providing the negative voltage to a well of the one of the plurality of address decoders associated with the selected memory block, and providing a ground voltage to respective wells of remaining ones of the plurality of address decoders.

In some embodiments, the negative voltage may be provided substantially simultaneously to at least two of the plurality of address decoders.

In some embodiments, a negative voltage line coupled to the well of the one of the plurality of address decoders may be selected in response to the block address when providing the negative voltage to the selected memory block, and the negative voltage may be provided to the well through the negative voltage line.

BRIEF DESCRIPTION OF THE DRAWINGS

The accompanying drawings are included to provide a further understanding of embodiments of the inventive concept, and are incorporated in and constitute a part of this specification. The drawings illustrate embodiments of the inventive concept and, together with the description, serve to explain principles of the inventive concept. In the drawings:

FIG. 9 is a diagram illustrating an embodiment of the arrangement of address decoders illustrated in FIG. 8;

DETAILED DESCRIPTION OF EMBODIMENTS

Figure 1:
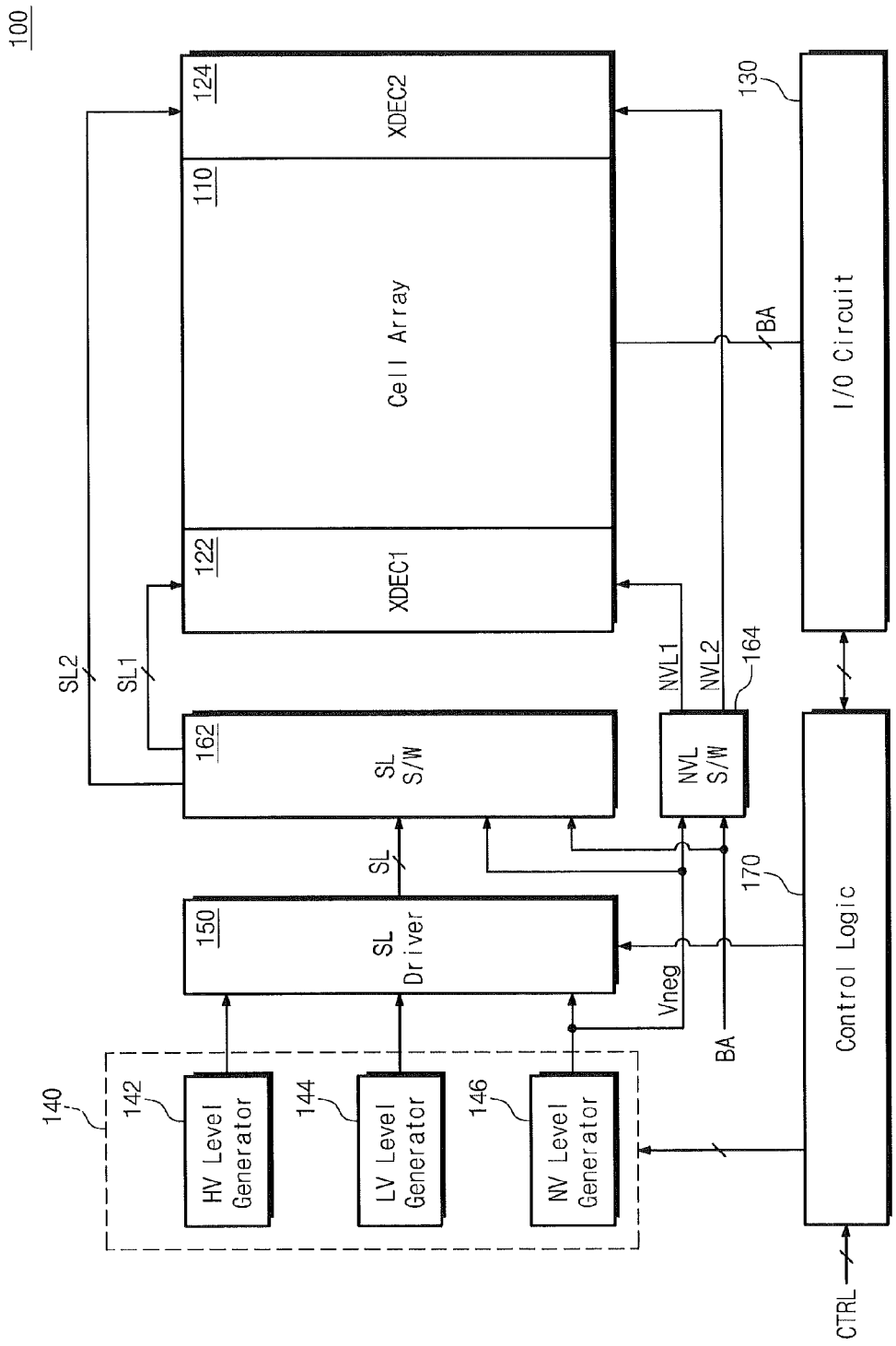
FIG. 1 is a block diagram of a nonvolatile memory device according to some embodiments of the inventive concept.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element is referred to as being "on", "connected to" or "coupled to" another element, it can be directly on, connected or coupled to the other element, or intervening elements may be present. In contrast, when an element is referred to as being "directly on," "directly connected to" or "directly coupled to" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper," "left," "right," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Hereinafter, some embodiments of the inventive concept will be described in detail with reference to the accompanying drawings.

FIG. 1 is a block diagram of a nonvolatile memory device according to some embodiments of the inventive concept.

Referring to FIG. 1, a nonvolatile memory device 100 may include a cell array 110, first and second address decoders 122 and 124, an input/output (I/O) circuit 130, a voltage generator 140, a selection line (SL) driver 150, first and second switch circuits SL S/W 162 and NVL S/W 164, and a control logic 170. The first and second switch circuits 162 and 164 may be configured to activate one of selection lines SL1 and SL2 and one of negative voltage lines NVL1 and NVL2 on the basis of block address (BA) information.

For example, the nonvolatile memory device 100 may be a NAND flash memory device, a NOR flash memory device, a resistive random access memory (RRAM) device, a phase-change random access memory (PRAM) device, a magnetoresistive random access memory (MRAM) device, a ferroelectric random access memory (FRAM) device, and/or a spin transfer torque random access memory (STT-RAM) device. Also, the nonvolatile memory device 100 may be configured to have a three-dimensional array structure. Hereinafter, for convenience, the nonvolatile memory device 100 is described as a NAND flash memory device.

The cell array 110 may include a plurality of memory blocks (not illustrated) that have a plurality of memory cells for storing data. Herein, each of the memory cells may include a nonvolatile memory cell that can retain data stored therein even when power supply thereto is interrupted.

The first address decoder (XDEC1) 122 may be disposed on the left hand of the cell array 110, and the second address decoder (XDEC2) 124 may be disposed on the right hand of the cell array 110. Each of the first and second address decoders 122 and 124 receives an input address, decodes the input address and enables one of the memory blocks according to the decoding result.

For example, the first address decoder 122 may drive a selected memory block by applying voltages provided via the first selection line SL1. The second address decoder 124 may drive a selected memory block by applying voltages provided via the second selection line SL2. Herein, a memory block of one of the first and second address decoders 122 and 124 may be selected by the input address. However, the inventive concept is not limited thereto. The inventive concept may include at least one memory block that is enabled by the input address.

Also, a well including the first address decoder 122 and a well including the second address decoder 124 may be separated or electrically isolated from each other. The well of the first address decoder 122 receives a well voltage through the first negative voltage line NVL1, and the well of the second address decoder 124 receives a well voltage through the second negative voltage line NVL2. Herein, the well voltage may include a negative voltage Vneg.

For example, when the first address decoder 122 receives the negative voltage Vneg through at least one of the first selection lines SL1, the well of the first address decoder 122 may receive the negative voltage Vneg through the first negative voltage line NVL1. On the other hand, when the first address decoder 122 does not receive the negative voltage Vneg through the first selection lines SL1, the well of the first address decoder 122 may receive a ground voltage through the first negative voltage line NVL1. In another exemplary embodiment, when the first address decoder 122 does not receive the negative voltage Vneg through the first selection lines SL1, the first negative voltage line NVL1 may become a floating state.

Also, when the second address decoder 124 receives the negative voltage Vneg through at least one of the second selection lines SL2, the well of the second address decoder 124 may receive the negative voltage Vneg through the second negative voltage line NVL2. On the other hand, when the second address decoder 124 does not receive the negative voltage Vneg through the second selection lines SL2, the well of the second address decoder 124 may receive a ground voltage through the second negative voltage line NVL2. In another exemplary embodiment, when the second address decoder 124 does not receive the negative voltage Vneg through the second selection lines SL2, the second negative voltage line NVL2 may be floated.

As described above, the nonvolatile memory device 100 may provide the negative voltage Vneg to the well of the address decoder that receives the negative voltage Vneg through at least one selection line, and may provide the ground voltage or a floating voltage to the well of the address decoder that does not receive the negative voltage Vneg through the selection lines.

Each of the address decoders 122 and 124 may provide bias voltages (e.g., a program voltage, a pass voltage, a string select voltage, and a ground select voltage) to a selected memory block in a program/read/erase operation. Herein, the bias voltages may be provided to the corresponding address decoder through one of the selection lines SL1 and SL2.

The I/O circuit 130 may be connected through a plurality of bit lines BL to the memory cell array 110. The I/O circuit 130 may include a plurality of page buffers (not illustrated). The page buffers may temporarily store data to be programmed into the memory cells corresponding to an input address in a selected memory block, or may temporarily store data read from the memory cells corresponding to an input address in a selected memory block.

The voltage generator 140 may generate voltages for driving the nonvolatile memory device 100 under the control of the control logic 170. The voltage generator 140 may include a high voltage (HV) level generator 142, a low voltage (LV) level generator 144, and a negative voltage (NV) level generator 146.

The HV level generator 142 may generate HV levels necessary for driving under the control of the control logic 170. Herein, the HV levels may be used as a program voltage and a pass voltage.

The LV level generator 144 may generate LV levels necessary for driving under the control of the control logic 170. Herein, the LV levels may be used as a read voltage and a read verify voltage.

The NV level generator 146 may generate NV levels necessary for driving under the control of the control logic 170. Herein, the NV levels may be used as a word line voltage and a well voltage. Herein, the word line voltage may be a program voltage, a pass voltage, a read voltage, a read verify voltage or an erase voltage provided to a word line.

In particular, the NV level generator 146 may generate the negative voltage Vneg to be provided to the selection line driver 150 and the first and second switch circuits 162 and 164. Herein, the negative voltage Vneg may be provided to the well of the first address decoder 122 through the well of the selection line driver 150, the well of the first and second switch circuits 162 and 164 and/or the first negative voltage line NVL1, and may be provided to the well of the second address decoder 124 through the second negative voltage line NVL2.

Meanwhile, the NV level generator 146 may be enabled according to whether a negative word line voltage is applied to at least one word line. That is, the NV level generator 146 may be disabled when a negative word line voltage (VWL) is not applied to at least one word line. However, the NV level generator 146 is not limited thereto. In another exemplary embodiment, the NV level generator 146 may be enabled regardless of whether a negative voltage is applied to a word line.

Under the control of the control logic 170, the selection line driver 150 may drive a plurality of selection lines SL with bias voltages generated by the voltage generator 140. For example, the selection line driver 150 may provide a program voltage to a selection line corresponding to an input address and may provide a pass voltage to the other selection lines. Also, the selection line driver 150 may provide a read voltage to a selection line corresponding to an input address and may provide a ground voltage to the other selection lines.

Meanwhile, when the selection line driver 150 provides the negative voltage Vneg to a selection line corresponding to an input address, the negative voltage Vneg is provided to the well of the selection line driver 150, thereby preventing a DC path from being formed in at least one internal element (e.g., a transistor) of the selection line driver 150. For example, the element may include an N-type doped region connected to a word line and a P-type doped well. Thus, when the negative voltage Vneg is provided to a selection line, that is, when the negative voltage Vneg is applied to the N-type doped region, the negative voltage Vneg is provided to the P-type doped well, thereby preventing a DC path from being formed between the P-type doped well and the N-type doped region.

On the other hand, when the selection line driver 150 does not provide the negative voltage Vneg to at least one selection line, a default voltage (e.g., the ground voltage) may be provided to the well of the selection line driver 150.

In FIG. 1, the level of the negative voltage provided to at least one selection line is substantially equal to the level of the negative voltage provided to the well. However, the inventive concept is not limited thereto. In the nonvolatile memory device 100, the level of the negative voltage provided to at least one selection line may be equal to or higher than the level of the negative voltage provided to the well.

The first switch circuit 162 may electrically connect the selection lines SL to one of the first selection lines SL1 and the second selection lines SL2 in response to the block address BA. That is, the first switch circuit 162 may activate one of the first selection lines SL1 and the second selection lines SL2 in response to the block address BA.

When the negative voltage Vneg is provided to at least one selection line, the negative voltage Vneg is provided to the well of the first switch circuit 162, thereby preventing a DC path from being formed in at least one internal element (e.g., a transistor) of the first switch circuit 162. On the other hand, when the negative voltage Vneg is not provided to the selection lines, a default voltage (e.g., the ground voltage) may be provided to the well of the first switch circuit 162. As another embodiment, when the negative voltage Vneg is not provided to the selection lines, the well of the first switch circuit 162 may be floated.

The second switch circuit 164 may provide the negative voltage Vneg to one of the first negative voltage line NVL1 and the second negative voltage line NVL2 in response to the block address BA. That is, the first switch circuit 162 may activate one of the first selection lines SL1 and the second selection lines SL2 in response to the block address BA. When the negative voltage Vneg is provided from the NL level generator 146, the negative voltage Vneg is provided to the well of the second switch circuit 164, thereby preventing a DC path from being formed in at least one internal element (e.g., a transistor) of the second switch circuit 164.

The control logic 170 may control an overall operation (e.g., a program/read/erase operation) of the nonvolatile memory device 100. The control logic 170 may perform a program/read/erase operation according to control signals CTRL received from an external device.

The control logic 170 may control the address decoders 122 and 124, the I/O circuit 130, the voltage generator 140 and the selection line driver 150 to perform a program operation according to an incremental step pulse program (ISPP) scheme.

A nonvolatile memory device may provide bias voltages through selection lines to address decoders in the same way. On the other hand, the nonvolatile memory device 100 according to some embodiments of the inventive concept includes the selection lines SL1 and SL2 for providing bias voltages to each of the address decoders 122 and 124, respectively, and provides bias voltages to the selected word lines according to the block address BA. Accordingly, the bias voltages are provided only to the address decoder corresponding to the block address BA, and the bias voltages are not provided to the other address decoder. Consequently, the nonvolatile memory device 100 according to embodiments of the inventive concept can greatly reduce the required voltage pumping capacity of the voltage generator 140 in comparison with the typical nonvolatile memory device.

Figure 2:
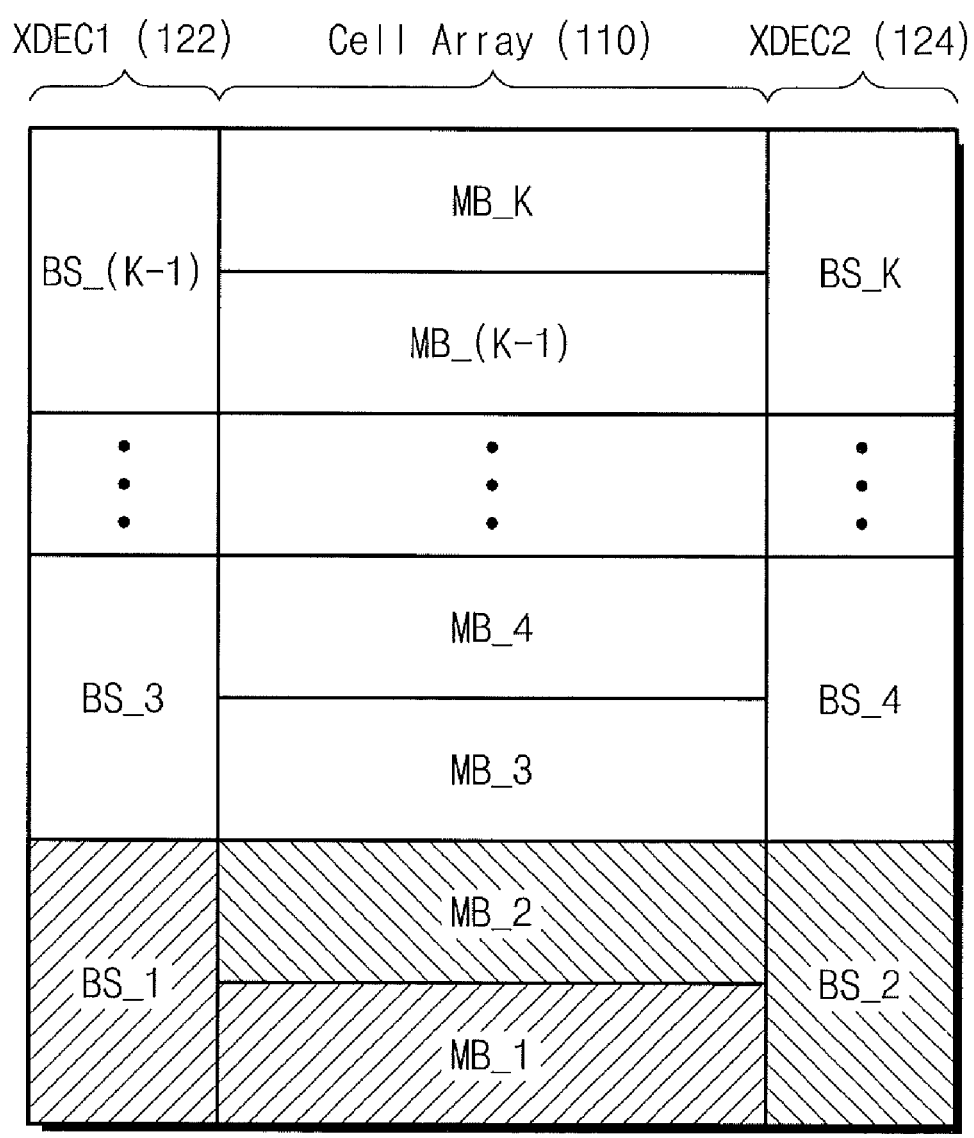
FIG. 2 is a diagram illustrating an embodiment of the arrangement of address decoders illustrated in FIG. 1.

FIG. 2 is a diagram illustrating an embodiment of the arrangement of the address decoders illustrated in FIG. 1.

Referring to FIG. 2, the cell array 110 may include a plurality of memory blocks MB_1, MB_2, MB_K. Herein, K is a natural number equal to or greater than 2. The first address decoder 122 may be disposed on the left hand of the cell array 110, and may include a plurality of block selectors BS_1, BS_3, . . . , BS_(K−1). The second address decoder 124 may be disposed on the right hand of the cell array 110, and may include a plurality of block selectors BS_2, BS_4, BS_K.

Herein, each of the block selectors BS_1, BS_3, BS_(K−1) may drive the corresponding memory block. For example, the first block selector BS_1 may drive the first memory block MB_1. The second block selector BS_2 may drive the second memory block MB_2. The $K^{th}$ block selector BS_K may drive the $K^{th}$ memory block MB_K.

The arrangement of the address decoders 122 and 124 is not limited to the illustration of FIG. 2. The address decoders 122 and 124 may be disposed variously in different wells.

Figure 3:
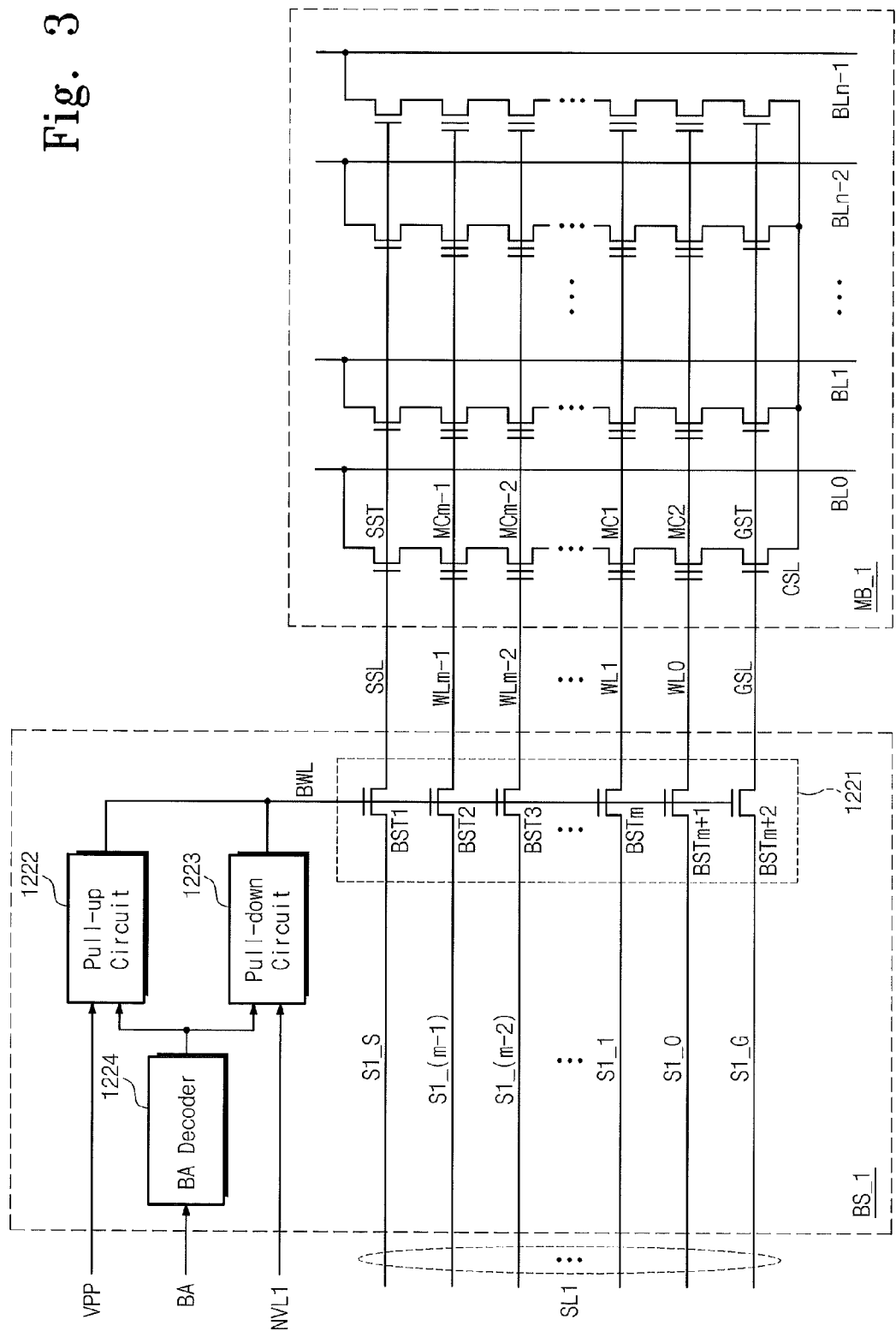
FIG. 3 is a diagram illustrating an embodiment of a first memory block and a first block selector illustrated in FIG. 2.

FIG. 3 is a diagram illustrating an exemplary embodiment of the first memory block and the first block selector illustrated in FIG. 2.

Referring to FIG. 3, the first memory block MB_1 may include a plurality of memory cells disposed at the intersections of word lines WL0~WLm−1 and bit lines BL0~BLn−1. Herein, m and n are natural numbers. The memory block may include a plurality of pages. Each of the pages may include a plurality of memory cells connected to the corresponding word line.

Each of the memory cells may store data of one bit or data of two or more bits. A memory cell capable of storing data of one bit per cell is called a single level cell (SLC). A memory cell capable of storing data of two or more bits per cell is called a multi level cell (MLC). The SLC has an erase state and a program state according to a threshold voltage. The MLC has one of a plurality of program states and an erase state according to threshold voltages.

Referring to FIG. 3, the memory block MB_1 may be implemented to have a cell string structure. Each cell string may include: a string selection transistor SST connected to a string selection line SSL; memory cells MC0~MCm−1 connected respectively to word lines WL0~WLm−1; and a ground selection transistor GST connected to a ground selection line GSL. Herein, the string selection transistor SST may be connected between a bit line and a string channel, and the ground selection transistor GST may be connected between a string channel and a common source line CSL.

The first block selector BS_1 may be connected to the first memory block MB_1 through the selection lines SSL and GSL and the word lines WL0~WLm−1. In a program/read operation, the first block selector BS_1 may receive a block address BA and determine whether to enable the first memory block MB_1 according to the block address BA.

That is, the first block selector BS_1 may electrically connect the first selection lines SL1 to the word lines WL0~WLm−1 and the selection lines SSL and GSL of the first memory block MB_1 in response to the block address BA.

The first block selector BS_1 may include a block selection switch 1221, a pull-up circuit 1222, a pull-down circuit 1223, and a block address (BA) decoder 1224. As shown in FIG. 2, the first block selector BS_1 of FIG. 3 is included in the address decoder 122 of FIG. 1.

The block selection switch 1221 may be disposed between the first selection lines SL1: G1_S, SL1_0~SL1_(m−1) and S1_S and the selection lines SSL, GSL and WL0~WLm−1. The block selection switch 1221 may include a plurality of block selection transistors BST1~BSTm+2.

Each of the block selection transistors BST1~BSTm+2 may electrically connect one of the first selection lines SL1 and one of the selection lines SSL, GSL and WL0~WLm−1 in response to a voltage provided to a block word line BWL. Herein, the block word line BWL may be connected to the gates of the block selection transistors BST1~BSTm+2.

A switching operation of the block selection switch 1221 is as follows. For example, when a high voltage VPP is provided to the block word line BWL, the block selection switch 1221 may electrically connect the first selection lines SL1 and the selection lines SSL, GSL and WL0~WLm−1 of the first memory block MB_1 by switching on the block selection transistors BST1~BSTm+2. Herein, when the negative voltage Vneg is provided to at least one of the first selection lines SL1, the negative voltage Vneg may be provided to the well of the block selection transistors BST1~BSTm+2. The switching operation of the block selection switch 1225 shown in FIG. 4 may be similarly performed.

On the other hand, when the high voltage VPP is not provided to the block word line BWL, the block selection switch 1221 may electrically disconnect the first selection lines SL1 and the selection lines SSL, GSL and WL0~WLm−1 of the first memory block MB_1.

The pull-up circuit 1222 may be connected to the block word line BWL. The pull-up circuit 1222 may provide the high voltage VPP to the block word line BWL in response to the block enable signal. Herein, the block enable signal may be generated by the block address decoder 1224.

The pull-down circuit 1223 may be connected to the block word line BWL. The pull-down circuit 1223 may provide the voltage Vneg, provided by the first negative voltage line NVL1, to the block word line BWL in response to a block enable signal. Herein, the block enable signal may be generated by the block address decoder 1224.

When the pull-up circuit 1222 provides the high voltage VPP to the block word line BWL, the pull-down circuit 1223 may electrically disconnect the block word line BWL from the well of the first block selector BS_1. Also, when the pull-up circuit 1222 does not provide the high voltage VPP to the block word line BWL, the pull-down circuit 1223 may electrically connect the well of the first block selector BS_1 to the block word line BWL. That is, when the pull-up circuit 1222 does not provide the high voltage VPP to the block word line BWL, the pull-down circuit 1223 may provide the well voltage, provided through the first negative voltage line NVL1, to the block word line BWL.

The block address decoder 1224 may receive the block address BA to generate the block enable signal. Herein, the block enable signal may be determined as a combination of the block address BA and a discharge signal. Herein, the discharge signal may be provided from the control logic 170.

Figure 4:
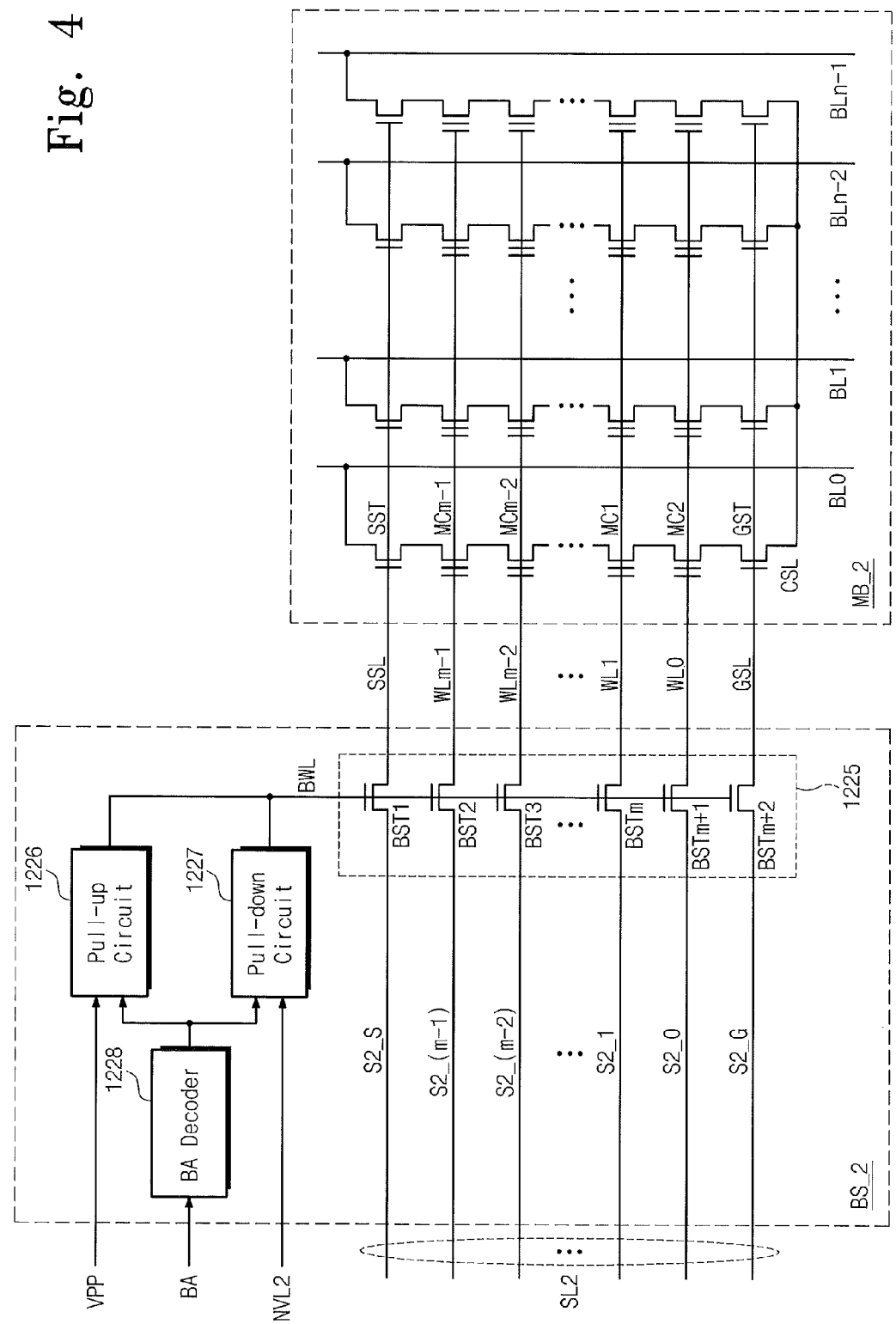
FIG. 4 is a diagram illustrating an embodiment of a second memory block and a second block selector illustrated in FIG. 2.

FIG. 4 is a diagram illustrating an embodiment of the second memory block and the second block selector illustrated in FIG. 2.

Referring to FIG. 4, the second memory block MB_2 may be implemented in the same manner as the first memory block MB_1 of FIG. 2. The second block selector BS_2 includes a block selection switch 1225, a pull-up circuit 1226, a pull-down circuit 1227, and a block address (BA) decoder 1228, and may be implemented in the same manner as the first block selector BS_1 with the exception that the second block selector BS_2 is connected to the second selection lines SL2 and the second negative voltage line NVL2. As shown in FIG. 2, the second block selector BS_2 of FIG. 4 is included in the address decoder 124 of FIG. 1.

Figure 5:
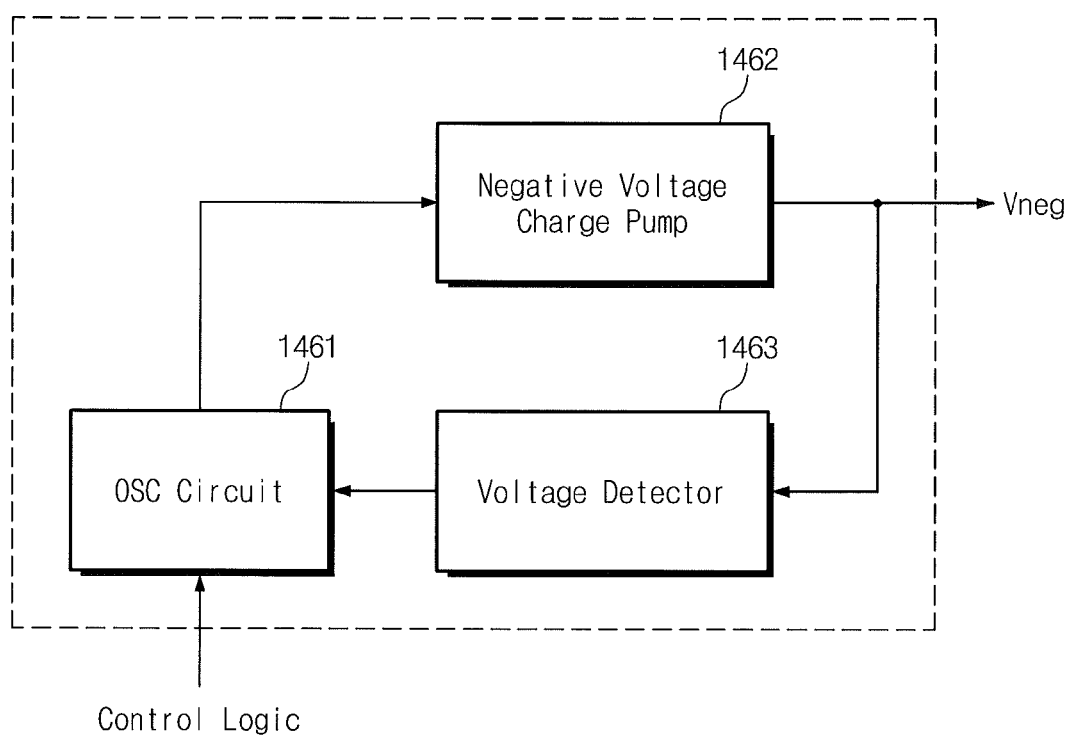
FIG. 5 is a diagram illustrating a negative voltage (NV) level generator according to some embodiments of the inventive concept.

FIG. 5 is a diagram illustrating the NV level generator according to an embodiment of the inventive concept.

Referring to FIG. 5, the NV level generator 146 may include an oscillator (OSC) circuit 1461, a negative voltage charge pump 1462, and a voltage detector 1463.

The oscillator circuit 1461 may generate an oscillation signal under the control of the control logic 170 or according to the detection result of the voltage detector 1463.

The negative voltage charge pump 1462 may operate a negative charge pumping operation for an output terminal in response to the oscillation signal. Accordingly, the negative voltage charge pump 1462 may cause the voltage of the output terminal to be the negative voltage Vneg.

The voltage detector 1463 may detect the voltage of the output terminal, compare the detected voltage with a target voltage, and output the comparison result value to the oscillator circuit 1461.

Meanwhile, the HV level generator 142 and the LV level generator 144 may be implemented to have a similar structure to the NV level generator 146 of FIG. 5.

Figure 6:
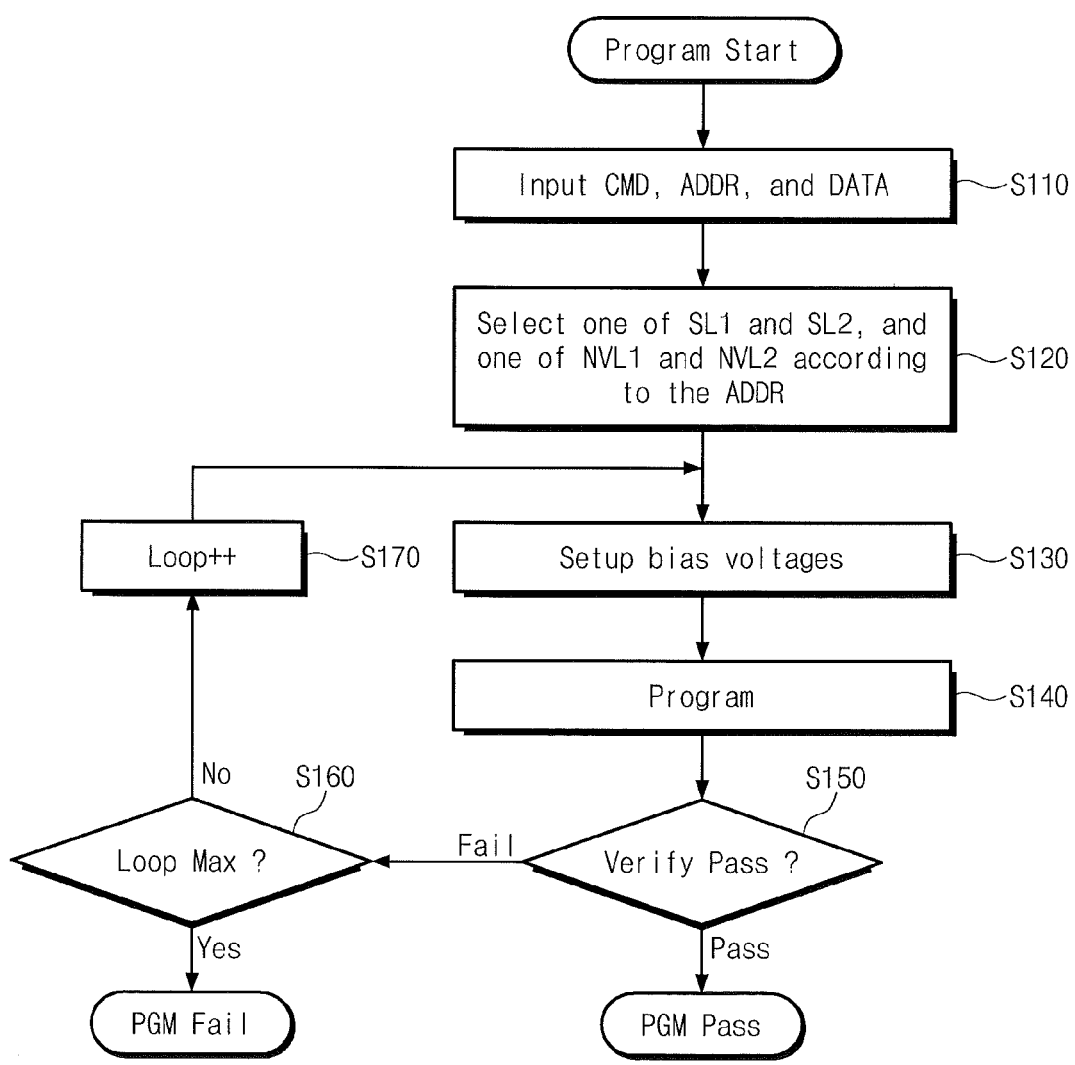
FIG. 6 is a flow chart illustrating an embodiment of the program operation of the nonvolatile memory device illustrated in FIG. 1.

FIG. 6 is a flow chart illustrating an embodiment of the program operation of the nonvolatile memory device illustrated in FIG. 1.

Referring to FIGS. 1 to 6, the program operation of the nonvolatile memory device 100 is performed as follows.

In the program operation, the nonvolatile memory device 100 receives a command CMD, an address ADDR, data from an external device (e.g., a memory controller) (S110). Herein, the received data are loaded into each page buffer of the I/O circuit 130 of FIG. 1.

The first switch circuit 162 of FIG. 1 electrically connects the selection lines SL to one of the first selection lines SL1 and the second selection lines SL2 according to the input address ADDR. Also, the second switch circuit 164 of FIG. 1 provides the generated negative voltage Vneg to one of the first negative voltage line NVL1 and the second negative voltage line NVL2 according to the input address ADDR (S120).

The voltage generator 140 of FIG. 1 generates bias voltages (e.g., a program voltage, a pass voltage, a high voltage, a well voltage, and verify read voltage) necessary for the program operation under the control of the control logic 170 of FIG. 1 (S130).

Thereafter, the control logic 170 performs a program loop. The control logic 170 sets up the bit lines BL0~BLn−1 according to the data loaded into the page buffers. Thereafter, a pass voltage is applied to the unselected word lines and a program voltage is applied to the selected word line. Herein, the level of the program voltage increases by a predetermined value according to an increase in the loop count (S140).

A pass voltage may be applied to the selected word line for a predetermined time before the applying of the program voltage. Thereafter, a program recovery operation is performed. In the program recovery operation, the bias voltages applied to the word lines WL0~WLm−1 and the string selection line SSL are discharged and the voltages applied to the bit lines BL0~BLn−1 are discharged.

Thereafter, the control logic 170 uses at least one verify read voltage level to perform a verify read operation. A program pass/fail is determined as a result of the verify read operation (S150). If a program pass occurs, the program loop is terminated.

On the other hand, if a program fail occurs, the control logic 170 determines whether the loop count is the maximum value (S160). If the loop count is the maximum value, the program operation is determined as fail. On the other hand, if the loop count is not the maximum value, the loop count increases and the next program loop is performed (S170).

Figure 7:
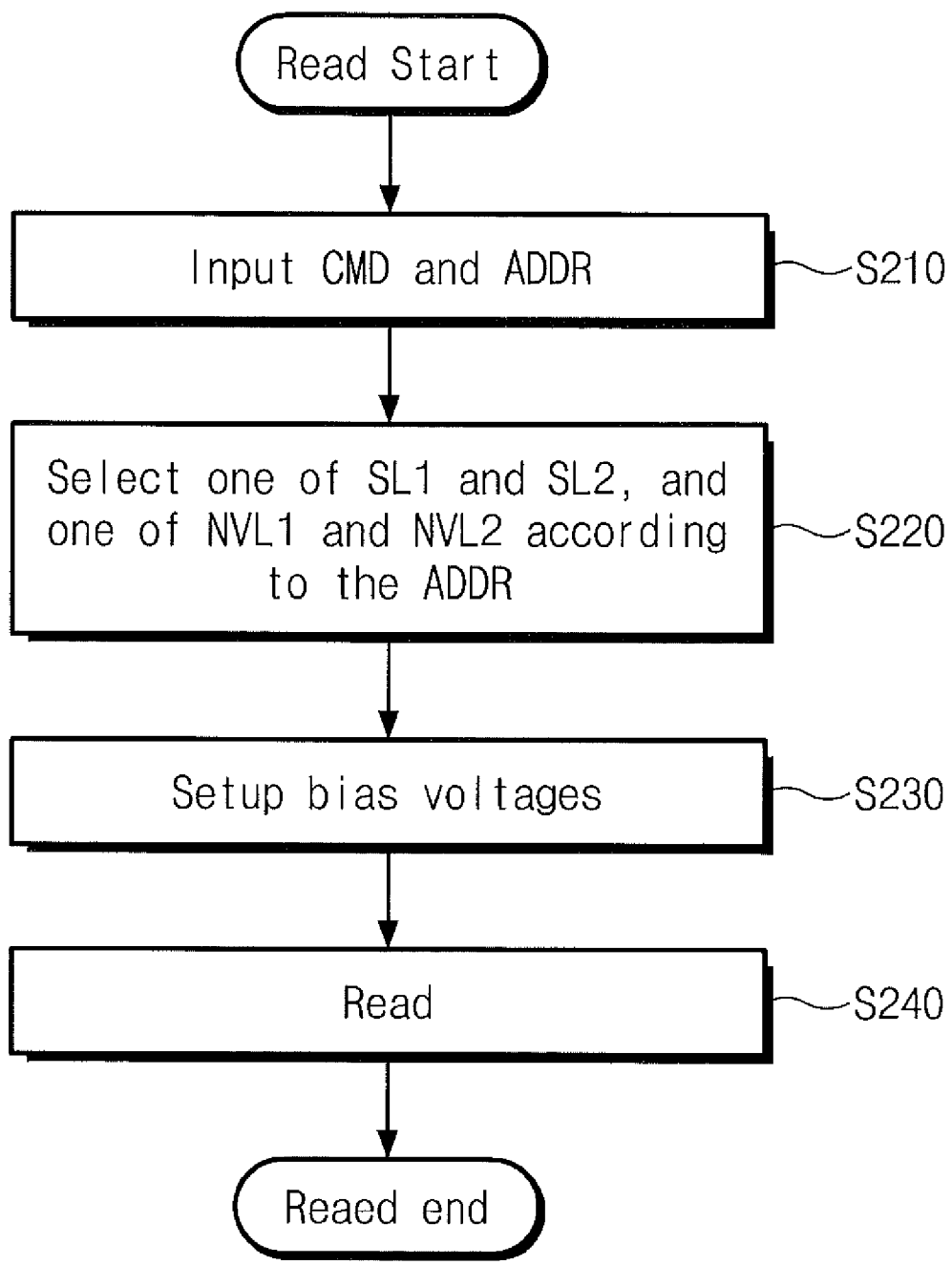
FIG. 7 is a flow chart illustrating an embodiment of the read operation of the nonvolatile memory device illustrated in FIG. 1.

FIG. 7 is a flow chart illustrating an embodiment of the read operation of the nonvolatile memory device illustrated in FIG. 1.

Referring to FIGS. 1 to 5 and 7, the read operation of the nonvolatile memory device 100 is performed as follows.

In the read operation, the nonvolatile memory device 100 receives a command CMD and an address ADDR from an external device (e.g., a memory controller) (S210).

The first switch circuit 162 of FIG. 1 electrically connects the selection lines SL to one of the first selection lines SL1 and the second selection lines SL2 according to the input address ADDR. Also, the second switch circuit 164 of FIG. 1 provides the generated negative voltage Vneg to one of the first negative voltage line NVL1 and the second negative voltage line NVL2 according to the input address ADDR (S220).

The voltage generator 140 of FIG. 1 generates bias voltages (e.g., a read voltage, a high voltage, and a well voltage) necessary for the read operation under the control of the control logic 170 of FIG. 1 (S230).

Thereafter, the control logic 170 uses at least one read voltage level to perform a read operation. The data read from the memory cells corresponding to the input address are stored in the page buffers. Thereafter, the data stored in the page buffers are outputted to the external device (e.g., the memory controller) (S240). Accordingly, the read operation is completed.

Figure 8:
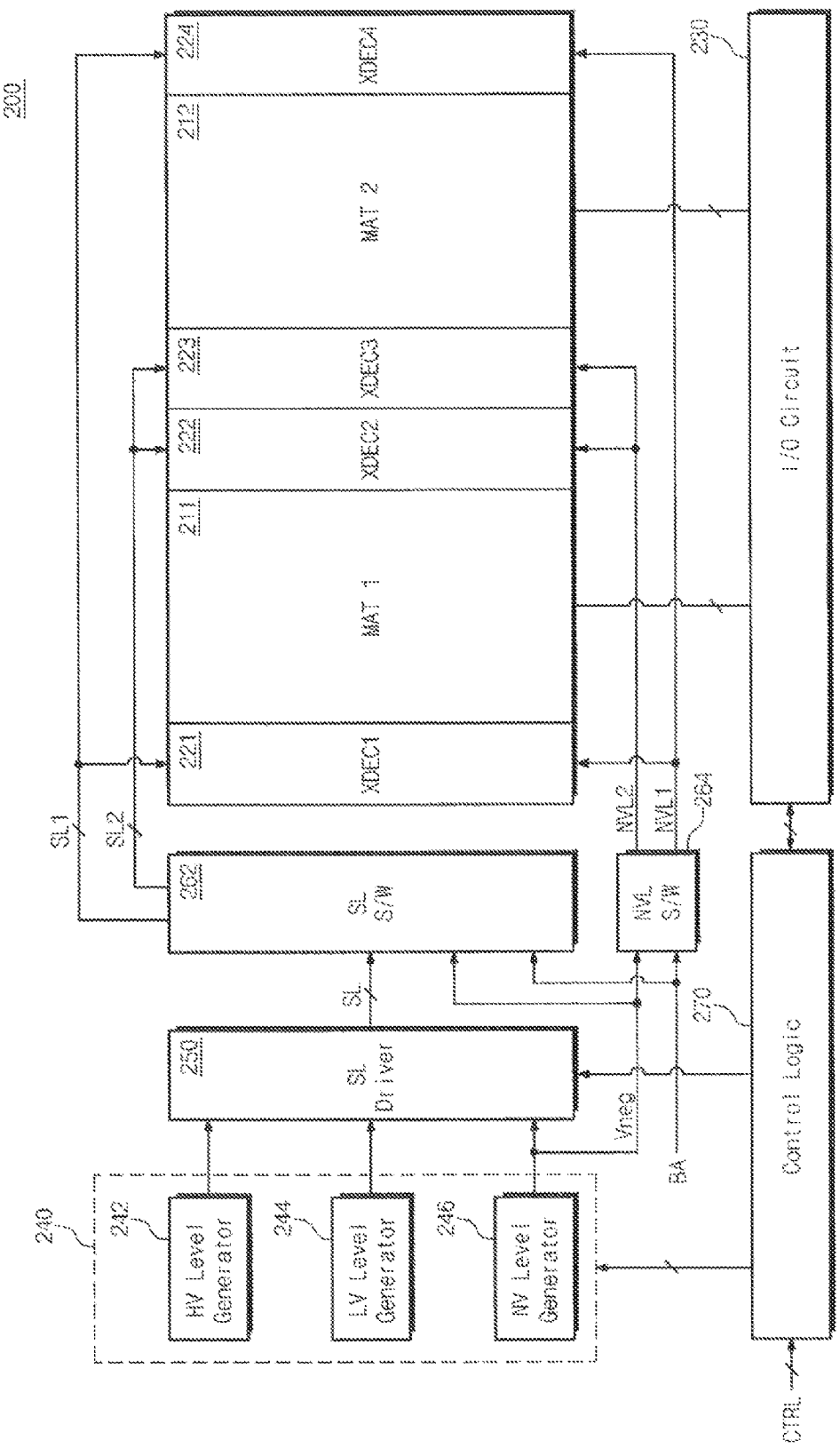
FIG. 8 is a block diagram of a nonvolatile memory device according to further embodiments of the inventive concept.

FIG. 8 is a block diagram of a nonvolatile memory device according to further embodiments of the inventive concept.

Referring to FIG. 8, a nonvolatile memory device 200 may include first and second matrices or mats 211 and 212, first to fourth address decoders 221-224, an input/output (I/O) circuit 230, a voltage generator 240, a selection line (SL) driver 250, first and second switch circuits 262 and 264, and a control logic 270.

The first mat 211 may be implemented in the same manner as the cell array 110 of FIG. 1. The second mat 212 may be implemented in the same manner as the cell array 110 of FIG. 1.

The first and second address decoders 221 and 222 may be disposed respectively on both sides of the first mat 211. The first and second address decoders 221 and 222 may be implemented in the same manner as the first and second address decoders 122 and 124 of FIG. 1, respectively.

The third and fourth address decoders 223 and 224 may be disposed respectively on both sides of the second mat 212. The third and fourth address decoders 223 and 224 may be implemented in the same manner as the first and second address decoders 122 and 124 of FIG. 1, respectively.

Referring to FIG. 8, the first selection lines SL1 may be connected to the first and fourth address decoders 221 and 224, and the second selection lines SL2 may be connected to the second and third address decoders 222 and 223.

A first negative voltage line NVL1 may be connected to the first and fourth address decoders 221 and 224, and a second negative voltage line NVL2 may be connected to the second and third address decoders 222 and 223.

Meanwhile, the first to fourth address decoders may be disposed in different wells.

The I/O circuit 230 may be connected through a plurality of bit lines to the first mat 211 or the second mat 212. The I/O circuit 230 may include a plurality of page buffers (not illustrated). The page buffers may temporarily store data to be programmed into the first mat 211 and/or the second mat 212, or may temporarily store data read from the first mat 211 or the second mat 212. The first mat 211 and the second mat 212 may be connected to a plurality of page buffers or may be connected to shared page buffers.

The voltage generator 240, the selection line driver 250 and the first and second switch circuits 262 and 264 may be implemented in the same manner as the voltage generator 140, the selection line driver 150 and the first and second switch circuits 162 and 164 of FIG. 1, respectively.

The control logic 270 may control an overall operation (e.g., a program/read/erase operation) of the nonvolatile memory device 200. The control logic 270 may perform a program/read/erase operation according to control signals CTRL received from an external device.

The control logic 270 may control the I/O circuit 230 differently according to whether it is a 1X mode or a 2X mode. Whether it is a 1X mode or a 2X mode may be determined according to whether an address is inputted one time or two times. For example, it may be determined as a 2X mode if an address and data are inputted two times in response one program command.

The nonvolatile memory device 200 of the inventive concept may enable two memory blocks simultaneously in the 2X mode. For example, in the 2X mode, one of the memory blocks of the first mat 211 is enabled in response to a first address and one of the memory blocks of the second mat 212 is enabled in response to a second address.

Also, a common well voltage may be provided to the wells of the address decoders with the enabled memory blocks. Herein, the common well voltage may be provided through one of the first and second negative voltage lines NVL1 and NVL2 selected by the second switch circuit 264.

A nonvolatile memory device may provide a bias voltage through selection lines to address decoders corresponding to at least one selected memory block and to the other address decoders, in the same way. On the other hand, the nonvolatile memory device 200 according to some embodiments of the inventive concept selects the selection lines to be activated and the negative voltage line to be activated, according to the block address BA, provides the bias voltages through the selected selection lines and the selected negative voltage lines to the address decoders corresponding to the selected memory block, and provides the ground voltage or the floating voltage to the other address decoders. Accordingly, the nonvolatile memory device 200 according to embodiments of the inventive concept can greatly reduce the required voltage pumping capacity of the voltage generator 240 in comparison with the typical nonvolatile memory device.

Figure 9:
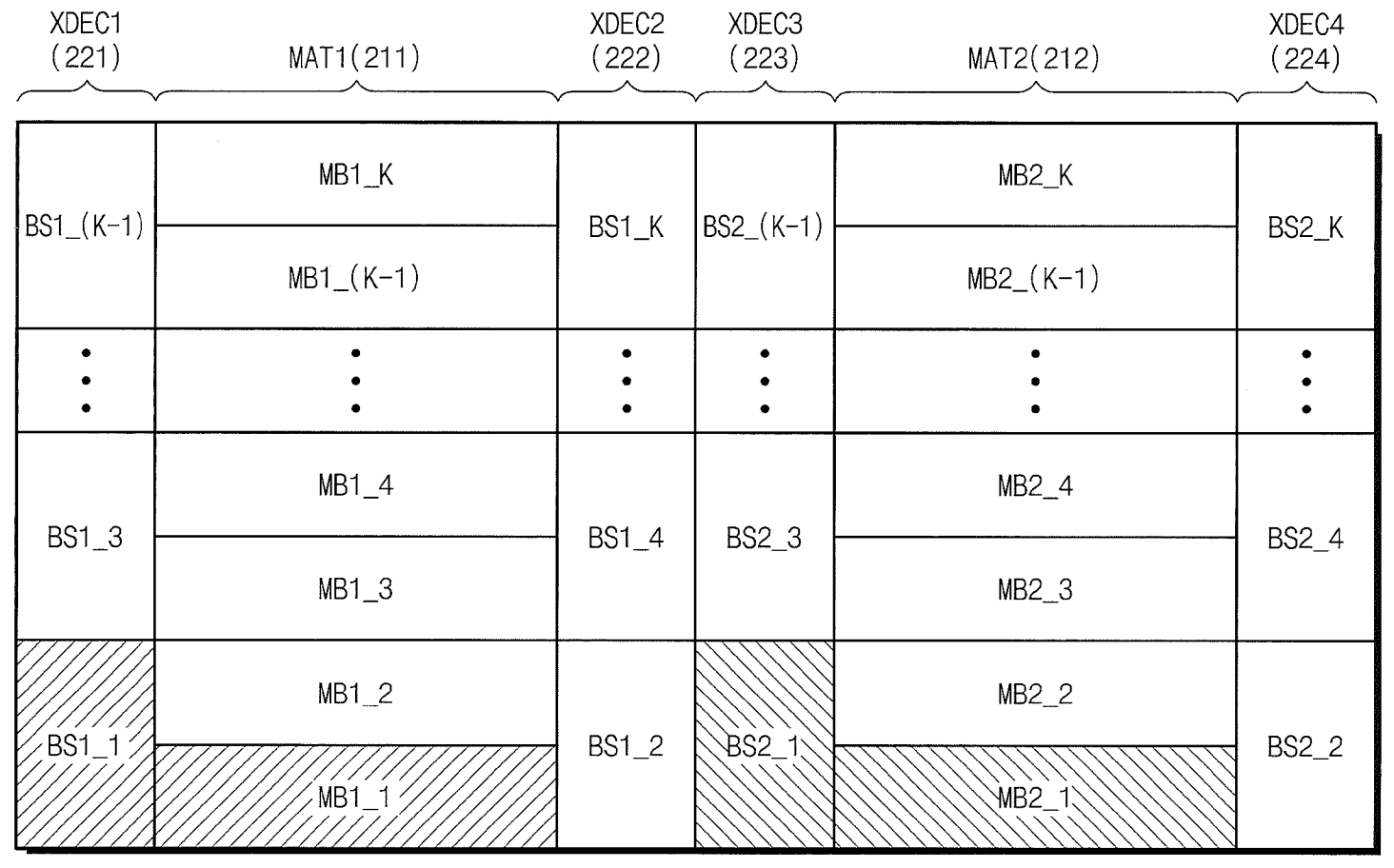

FIG. 9 is a diagram illustrating an embodiment of the arrangement of the address decoders illustrated in FIG. 8.

Referring to FIG. 9, the first mat 211 may include a plurality of memory blocks MB1_1, MB1_2, MB1_K, and the second mat 212 may include a plurality of memory blocks MB2_1, MB2_2, MB2_K. Herein, K is a natural number equal to or greater than 2.

The first address decoder 221 may be disposed on the left hand of the first mat 211, and may include a plurality of block selectors BS1_1, BS1_3, BS1_(K-1). The second address decoder 222 may be disposed on the right hand of the first mat 211, and may include a plurality of block selectors BS1_2, BS1_4, BS1_K.

The third address decoder 223 may be disposed on the left hand of the second mat 212, and may include a plurality of block selectors BS2_1, BS2_3, BS2_(K-1). The fourth address decoder 224 may be disposed on the right hand of the second mat 212, and may include a plurality of block selectors BS2_2, BS2_4, BS2_K.

Figure 10:
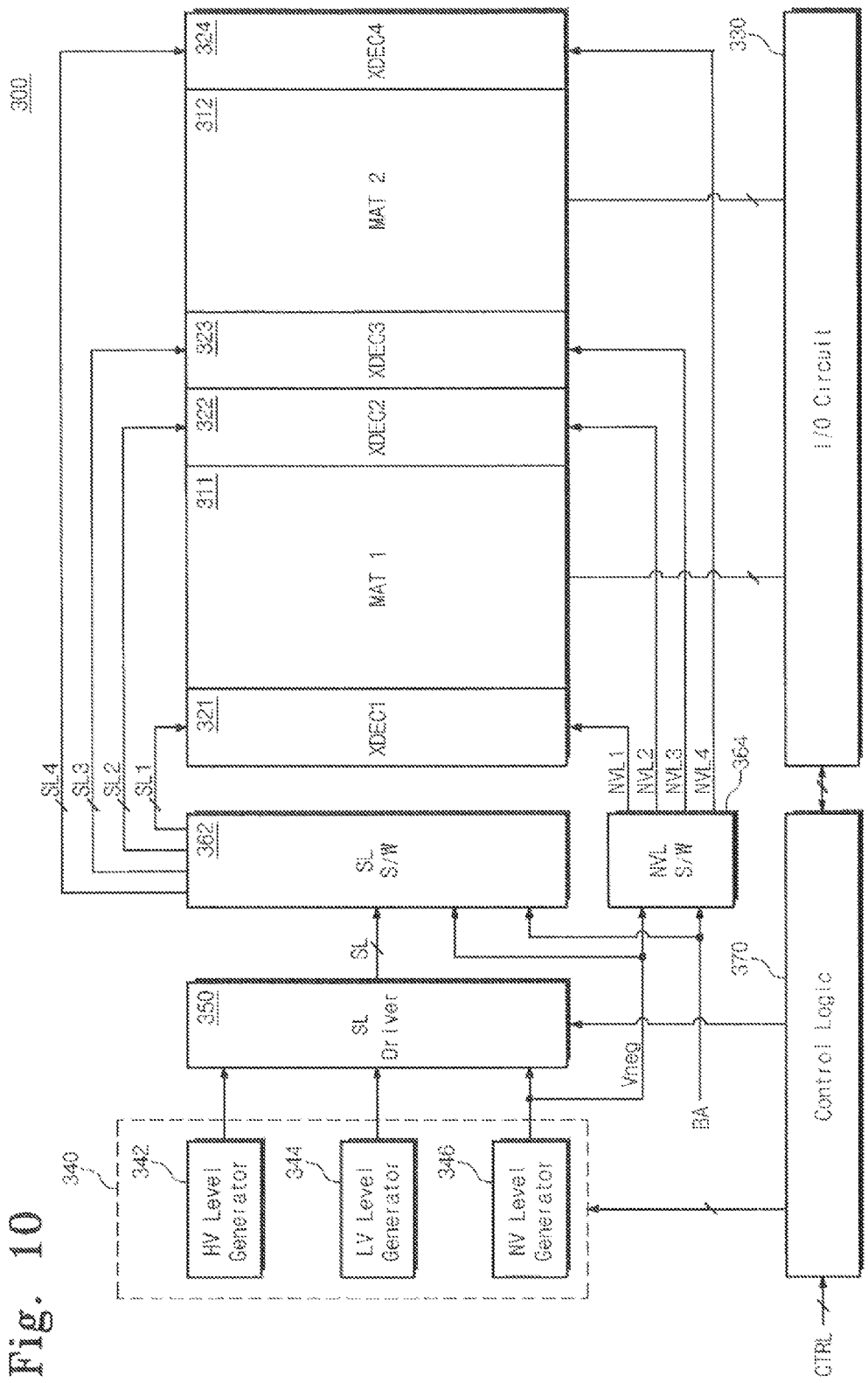
FIG. 10 is a block diagram of a nonvolatile memory device according to still further embodiments of the inventive concept.

FIG. 10 is a block diagram of a nonvolatile memory device according to an embodiment 3 of the inventive concept.

Referring to FIG. 10, a nonvolatile memory device 300 may include first and second mats 311 and 312, first to fourth address decoders 321~324, an input/output (I/O) circuit 330, a voltage generator 340, a selection line (SL) driver 350, first and second switch circuits 362 and 364, and a control logic 370.

The first and second mats 311 and 312 may be implemented in the same manner as the first and second mats 211 and 212 of FIG. 8. The first to fourth address decoders 321~324 may be implemented in the same manner as the first to fourth address decoders 221~224 of FIG. 8. The I/O circuit 330, the voltage generator 340 and the selection line driver 350 may be implemented in the same manner as the I/O circuit 230, the voltage generator 240 and the selection line driver 250 of FIG. 8, respectively.

The first switch circuit 362 may electrically connect the selection lines SL to one of the first to fourth selection lines SL1~SL4 in response to the block address BA. When the negative voltage Vneg is provided to at least one selection line, the negative voltage Vneg may be provided to the well of the first switch circuit 362. On the other hand, when the negative voltage Vneg is not provided to the selection lines, a default voltage (e.g., a ground voltage) may be provided to the well of the first switch circuit 362.

The second switch circuit 364 may provide the negative voltage Vneg to one of the first to fourth negative voltage lines NVL1~NVL4 in response to the block address BA. When the negative voltage Vneg is provided from the NL level generator 346, the negative voltage Vneg is provided to the well of the second switch circuit 1364, thereby preventing a DC path from being formed in at least one internal element (e.g., a transistor) of the second switch circuit 364.

The nonvolatile memory device 300 according to some embodiments of the inventive concept selects the selection lines to be activated and the negative voltage line to be activated, according to the block address BA, provides the bias voltages through the selected selection lines and the selected negative voltage lines to the address decoders including the selected memory block, and provides the ground voltage or the floating voltage to the other address decoders. Accordingly, the nonvolatile memory device 300 of the inventive concept can greatly reduce the required voltage pumping capacity of the voltage generator 340.

Figure 11:
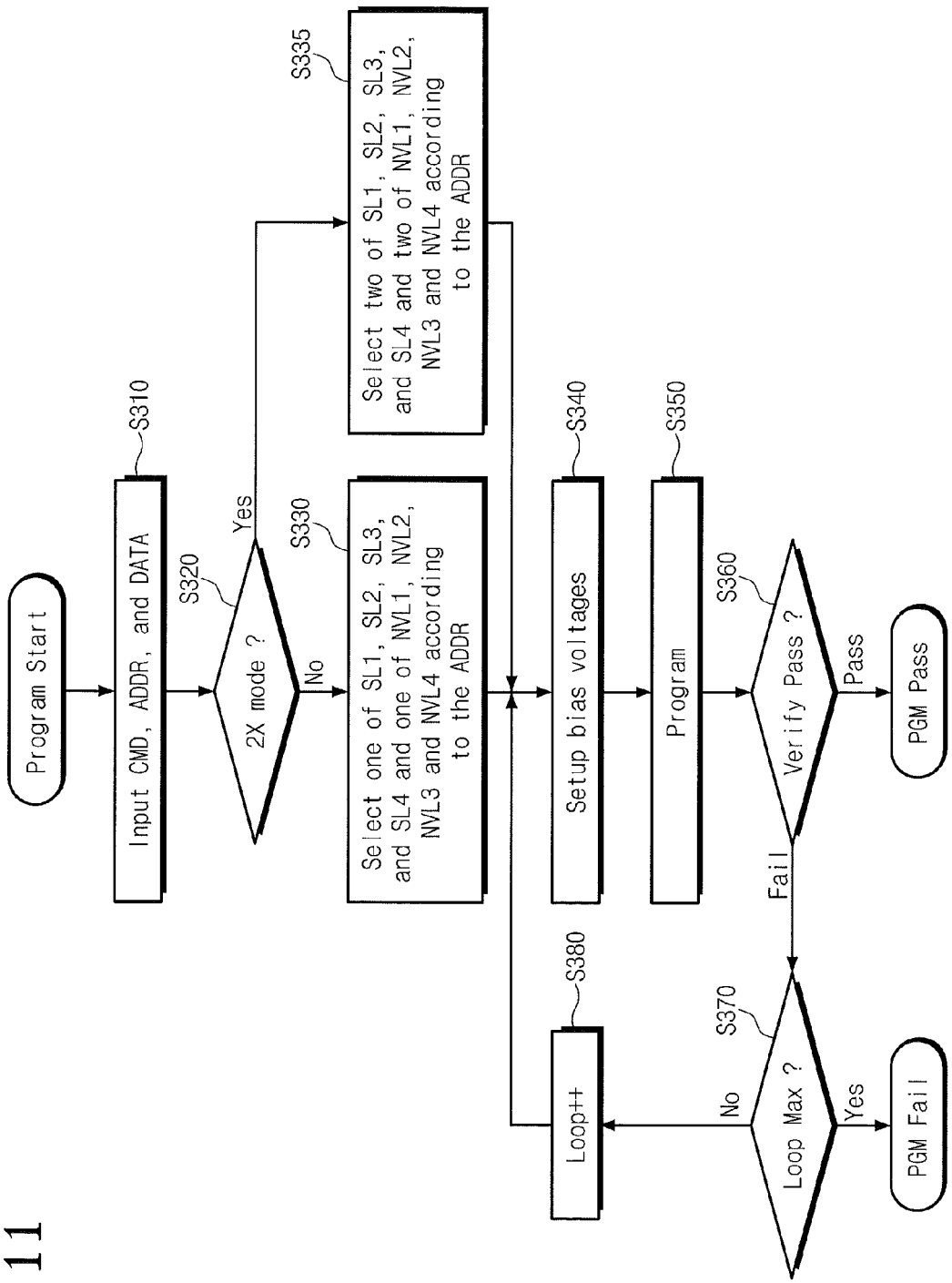
FIG. 11 is a flow chart illustrating an embodiment of the program operation of the nonvolatile memory device illustrated in FIG. 10.

FIG. 11 is a flow chart illustrating an embodiment of the program operation of the nonvolatile memory device illustrated in FIG. 10.

Referring to FIGS. 10 and 11, the program operation of the nonvolatile memory device 300 is performed as follows.

In the program operation, the nonvolatile memory device 300 receives a command CMD, an address ADDR, data from an external device (e.g., a memory controller) (S310). Herein, the received data are loaded into each page buffer of the I/O circuit 330 of FIG. 10.

Thereafter, the control logic 370 of FIG. 10 determines whether it is a 2X mode (S320). Whether it is a 2X mode may be determined according to whether an address is inputted two times in response to one write command. For example, it may be determined as a 2X mode if a first address and a second address are inputted in response one write command. Herein, the first address is used to select one of the memory blocks included in the first mat 311 and the second address is used to select one of the memory blocks included in the second mat 312.

If it is not a 2X mode, that is, if only one address is inputted, the first switch circuit 362 of FIG. 10 electrically connects the selection lines SL to one of the first to fourth selection lines SL1~S14 in response to the input address ADDR. Also, the second switch circuit 364 of FIG. 10 provides the negative voltage Vneg to one of the first to fourth negative voltage lines NVL1~NVL4 in response to the input address ADDR (S330).

On the other hand, if it is a 2X mode, that is, if two addresses are inputted, the first switch circuit 362 electrically connects the selection lines SL to one of the first and second selection lines SL1 and SL2 in response to the first address and electrically connects the selection lines SL to one of the third and fourth selection lines SL3 and SL4 in response to the second address. Also, the second switch circuit 364 provides the negative voltage Vneg to one of the first and second negative voltage lines NVL1 and NVL2 in response to the first address and provides the negative voltage Vneg to one of the third and fourth negative voltage lines NVL3 and NVL4 (S335).

The voltage generator 340 of FIG. 10 generates bias voltages (e.g., a program voltage, a pass voltage, a high voltage, a well voltage, and verify read voltage) used for the program operation under the control of the control logic 370 of FIG. 10 (S340).

Thereafter, the control logic 370 performs a program loop. The control logic 370 sets up the bit lines BL0~BLn−1 according to the data loaded into the page buffers. Thereafter, a pass voltage is applied to the unselected word lines and a program voltage is applied to the selected word line. Herein, the level of the program voltage increases by a predetermined value according to an increase in the loop count (S350).

A pass voltage may be applied to the selected word line for a predetermined time before the applying of the program voltage. Thereafter, a program recovery operation is performed. In the program recovery operation, the bias voltages applied to the word lines WL0~WLm−1 and the string selection line SSL are discharged and the voltages applied to the bit lines BL0~BLn−1 are discharged.

Thereafter, the control logic 370 uses at least one verify read voltage level to perform a verify read operation. A program pass/fail is determined as a result of the verify read operation (S360). If a program pass occurs, the program loop is terminated.

On the other hand, if a program fail occurs, the control logic 370 determines whether the loop count is the maximum value (S370). If the loop count is the maximum value, the program operation is determined as fail. On the other hand, if the loop count is not the maximum value, the loop count increases and the next program loop is performed (S380).

Figure 12:
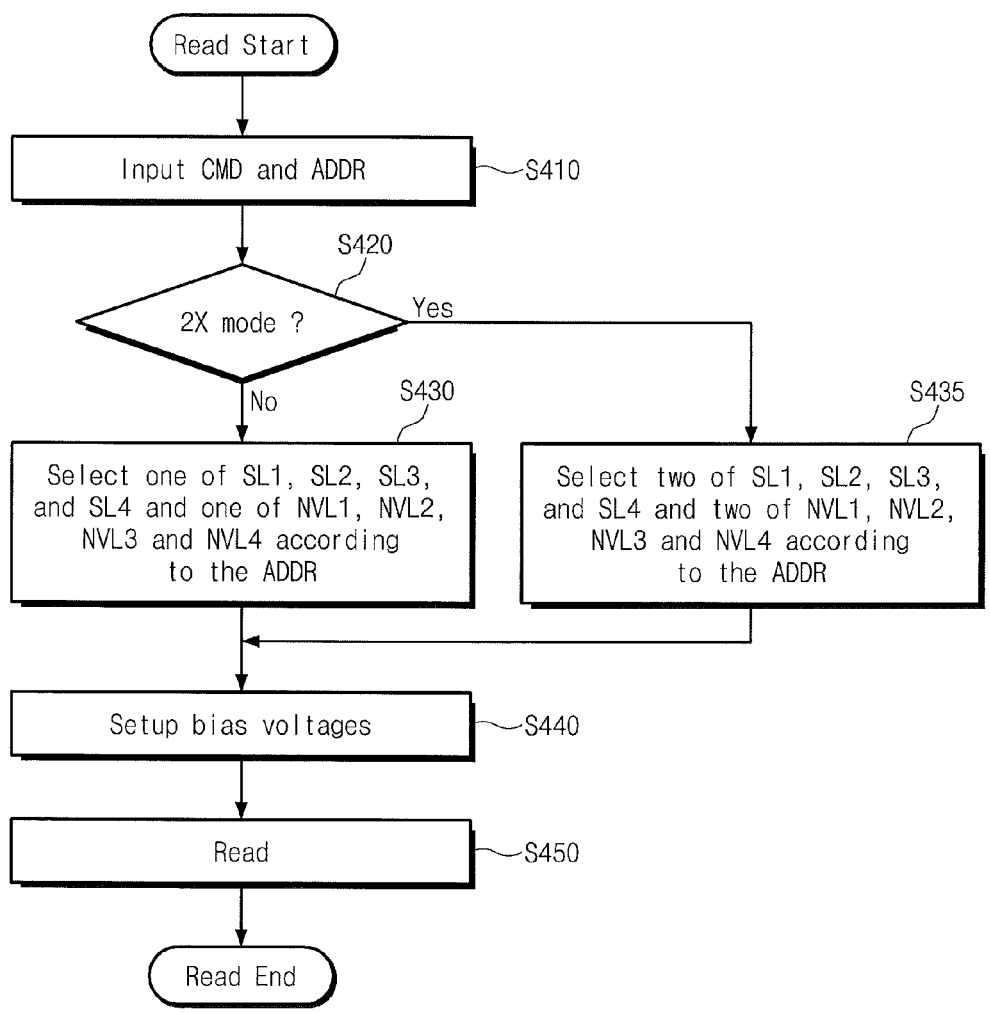
FIG. 12 is a flow chart illustrating an embodiment of the read operation of the nonvolatile memory device illustrated in FIG. 10.

FIG. 12 is a flow chart illustrating an embodiment of the read operation of the nonvolatile memory device illustrated in FIG. 10.

Referring to FIGS. 10 and 12, the read operation of the nonvolatile memory device 300 is performed as follows.

In the read operation, the nonvolatile memory device 300 receives a command CMD and an address ADDR from an external device (e.g., a memory controller) (S410).

Thereafter, the control logic 370 of FIG. 10 determines whether it is a 2X mode (S420).

If it is not a 2X mode, that is, if only one address is inputted, the first switch circuit 362 of FIG. 10 electrically connects the selection lines SL to one of the first to fourth selection lines SL1~SL4 in response to the input address ADDR. Also, the second switch circuit 364 of FIG. 10 provides the negative voltage Vneg to one of the first to fourth negative voltage lines NVL1~NVL4 in response to the input address ADDR (S430).

On the other hand, if it is a 2X mode, that is, if two addresses are inputted, the first switch circuit 362 electrically connects the selection lines SL to one of the first and second selection lines SL1 and SL2 in response to the first address and electrically connects the selection lines SL to one of the third and fourth selection lines SL3 and SL4 in response to the second address. Also, the second switch circuit 364 provides the negative voltage Vneg to one of the first and second negative voltage lines NVL1 and NVL2 in response to the first address and provides the negative voltage Vneg to one of the third and fourth negative voltage lines NVL3 and NVL4 (S435).

The voltage generator 340 of FIG. 10 generates bias voltages (e.g., a read voltage, a high voltage, and a well voltage) used for the read operation under the control of the control logic 370 (S440).

Thereafter, the control logic 370 uses at least one read voltage level to perform a read operation. The data read from the memory cells corresponding to the input address are stored in the page buffers. Thereafter, the data stored in the page buffers are outputted to the external device (e.g., the memory controller) (S450). Accordingly, the read operation is completed.

Figure 13:
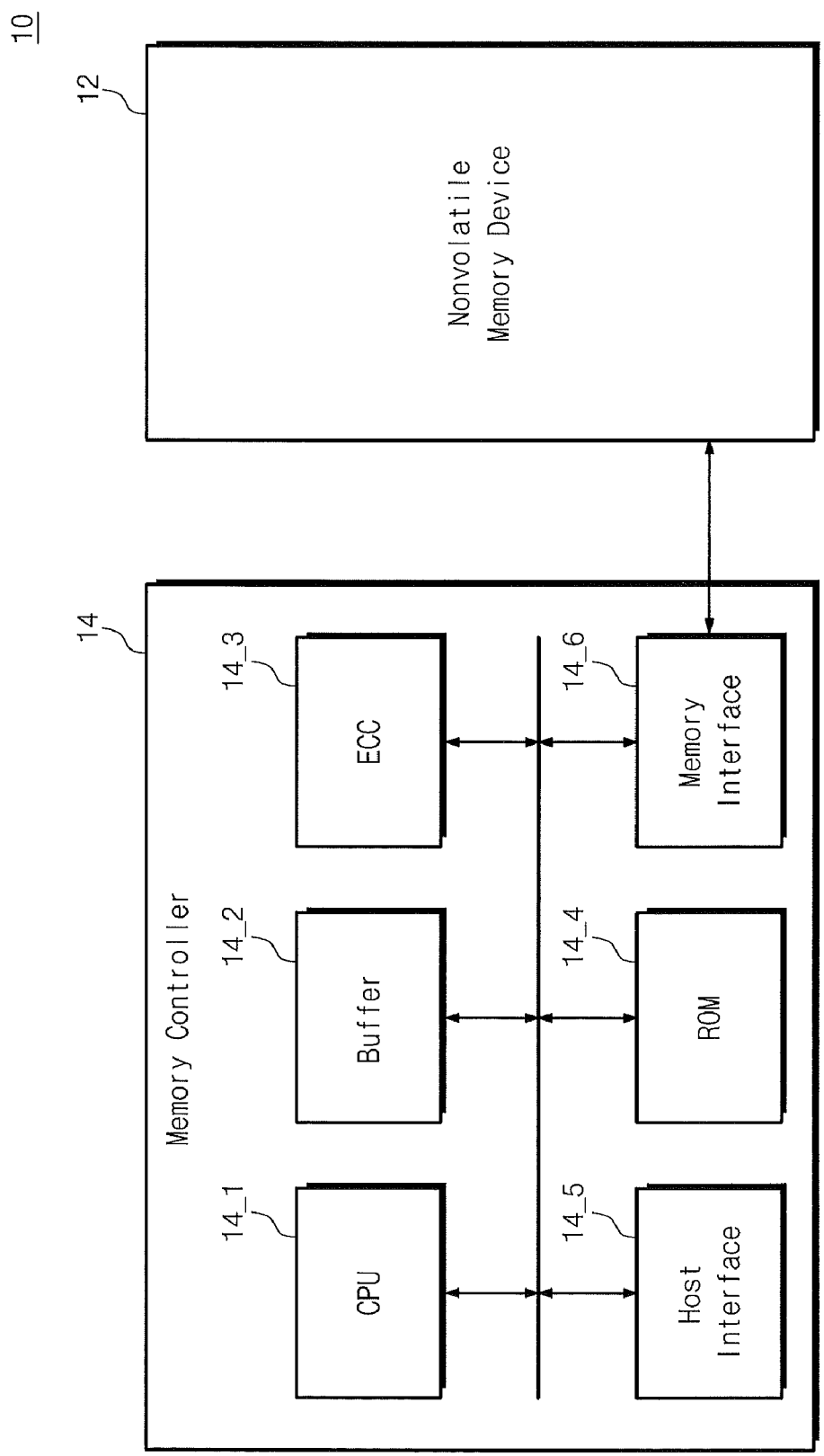
FIG. 13 is a block diagram of a memory system according to some embodiments of the inventive concept.

FIG. 13 is a block diagram of a memory system according to an embodiment of the inventive concept.

Referring to FIG. 13, a memory system 10 includes a nonvolatile memory device 12 and a memory controller 14.

The nonvolatile memory device 12 may be implemented in the same manner as one of the nonvolatile memory device 100 of FIG. 1, the nonvolatile memory device 200 of FIG. 8, and the nonvolatile memory device 300 of FIG. 10.

The memory controller 14 may control the nonvolatile memory device 12 at the request of an external device (e.g., a host). For example, the memory controller 14 may be configured to control a read/write/erase operation of the nonvolatile memory device 12.

The memory controller 14 may provide an interface between the nonvolatile memory device 12 and the host. The memory controller 14 may be configured to drive a firmware for controlling the nonvolatile memory device 12. The memory controller 14 may include a central processing unit (CPU) 14_1, a buffer 14_2, an error correction circuit (ECC) 14_3, a read-only memory (ROM) 14_4, a host interface 14_5, and a memory interface 14_6.

The CPU 14_1 may control an overall operation of the memory controller 14.

The buffer 14_2 may be used as a working memory of the CPU 14_1. At the write request of the host, data received from the host are temporarily stored in the buffer 14_2. Also, at the read request of the host, data read from the nonvolatile memory device 12 are temporarily stored in the buffer 14_2.

At the write request, the ECC 14_3 may use an error correction code to decode data stored in the buffer 14_2. Herein, the decoded data and an error correction code value used may be stored in the nonvolatile memory device 12. At the read request, the ECC 14_3 may use an error correction code value to recover data read from the nonvolatile memory device 12. Herein, the error correction code value may be included in the data.

The ROM 14_4 may store data used to drive the memory controller 14.

The host interface 14_5 may include a protocol for data exchange between the host and the memory controller 14. For example, the memory controller 14 may be configured to communicate with an external device (host) through various interface protocols such as Universal Serial Bus (USB) protocol, Multimedia Card (MMC) protocol, Peripheral Component Interconnection (PCI) protocol, PCI-Express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, and/or Integrated Drive Electronics (IDE) protocol.

The memory interface 14_6 may be configured to interface between the nonvolatile memory device 12 and the memory controller 14.

Figure 14:
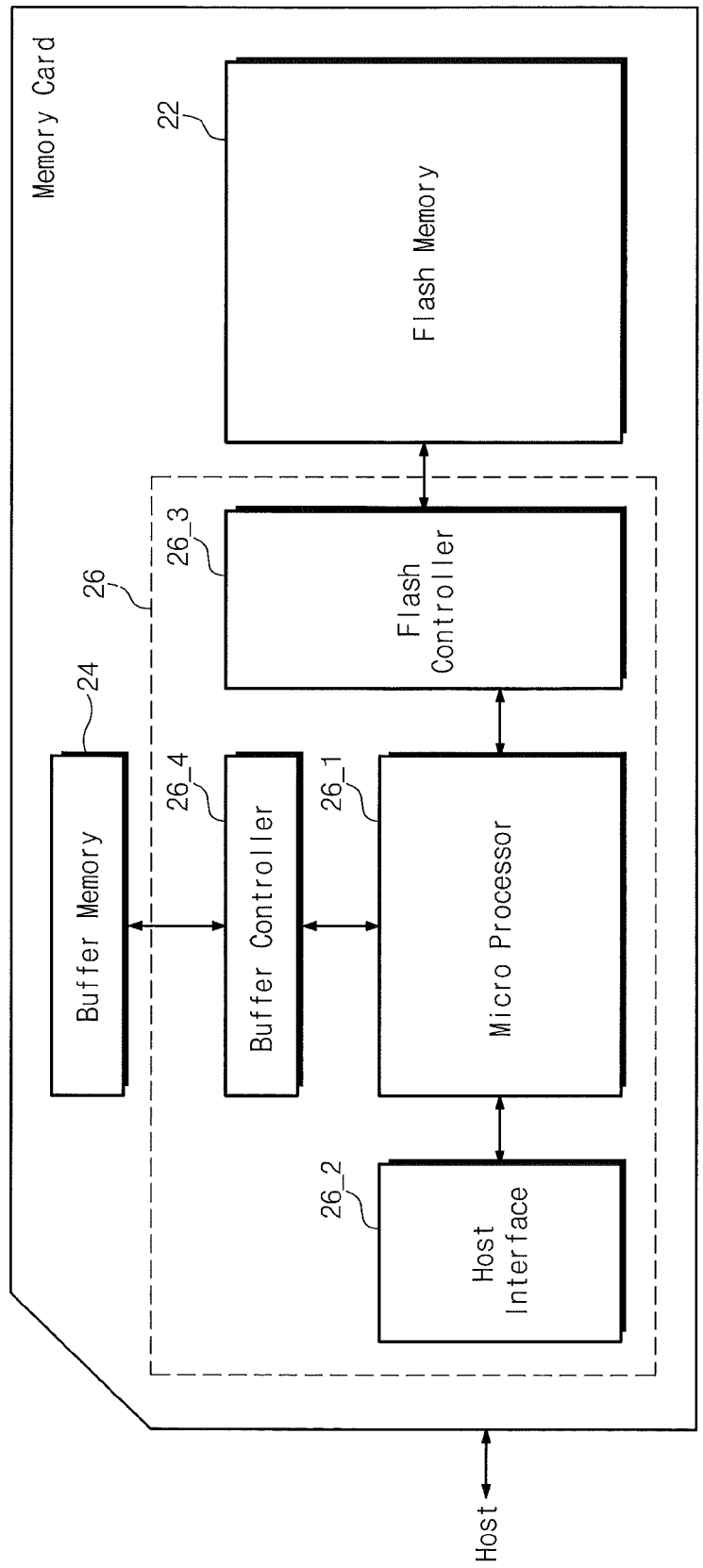
FIG. 14 is a block diagram of a memory card according to some embodiments of the inventive concept.

FIG. 14 is a block diagram of a memory card according to an embodiment of the inventive concept.

Referring to FIG. 14, a memory card 20 includes a flash memory 22, a buffer memory 24 and a memory controller 26 controlling the flash memory 22 and the buffer memory 24.

The Flash memory 22 may be implemented in the same manner as one of the nonvolatile memory device 100 of FIG. 1, the nonvolatile memory device 200 of FIG. 8, and the nonvolatile memory device 300 of FIG. 10.

The buffer memory 24 is used to temporarily store data generated during the operation of the memory card 20. The buffer memory 24 may be implemented using a DRAM or an SRAM.

The memory controller 26 may be connected between a host and the flash memory 22. The memory controller 26 may be configured to access the flash memory 22 in response to the request of the host.

The memory controller 26 may include a microprocessor 26_1, a host interface 26_2, a flash controller 26_3, and a buffer controller 26_4.

The memory controller 26 may be configured to drive a firmware for controlling the flash memory 22. The host interface 26_2 may be configured to interface with the host through a card (e.g., MMC) protocol for data exchange between the host and the memory controllers 26_3 and 26_4.

The memory card 20 may be applicable to Multimedia Card (MMC), Security Digital (SD), miniSD, Memory Stick, SmartMedia, and TransFlash Card.

Figure 15:
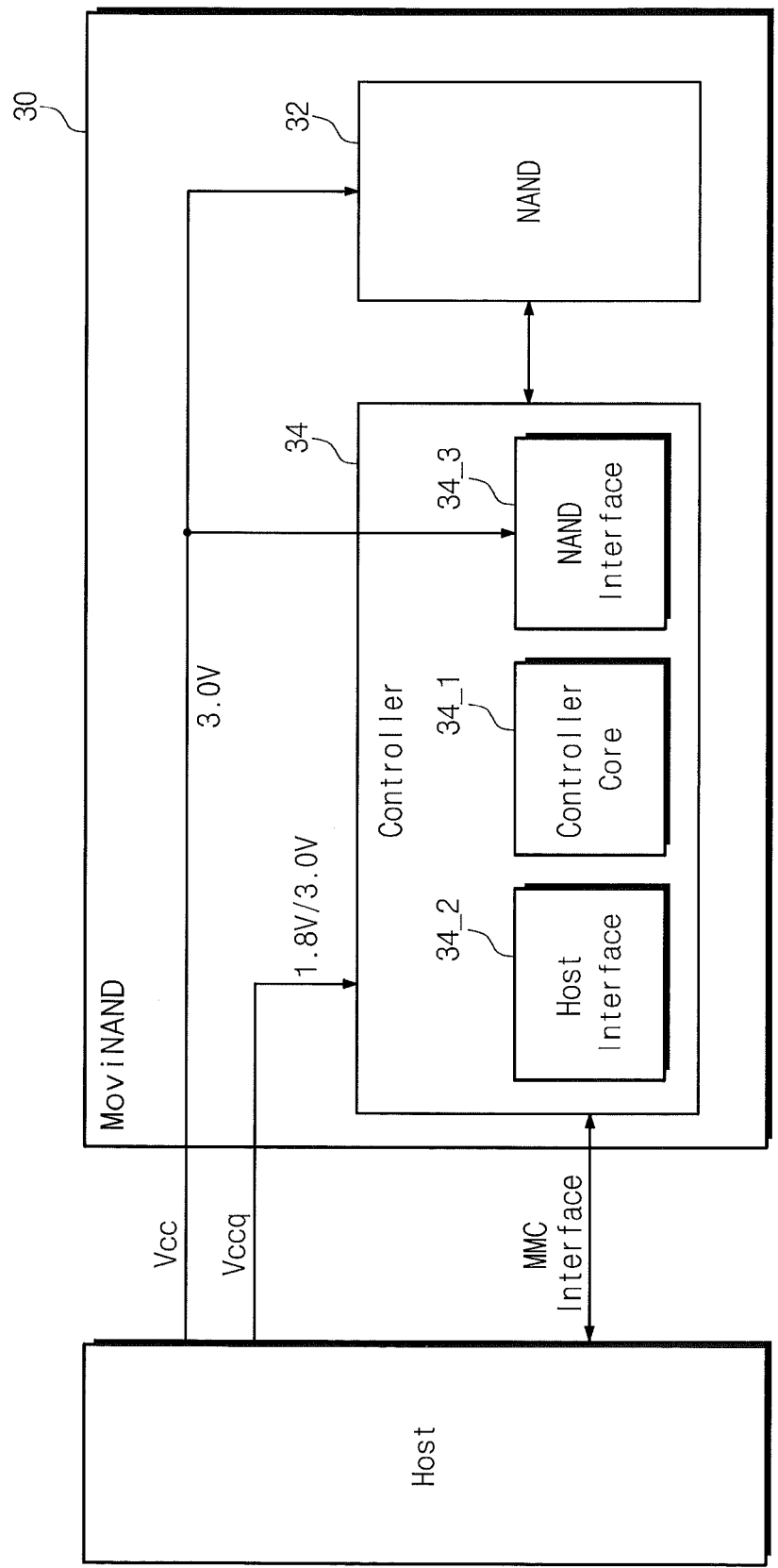
FIG. 15 is a block diagram of a MoviNAND according to some embodiments of the inventive concept.

FIG. 15 is a block diagram of a MoviNAND™ according to an exemplary embodiment of the inventive concept.

Referring to FIG. 15, a MoviNAND™ device 30 may include a NAND flash memory device 32 and a controller 34.

The NAND flash memory device 32 may be configured using a stack of unitary NAND flash memories in a package (e.g., Fine-pitch Ball Grid Array (FBGA)). Each of the unitary NAND flash memories may be implemented in the same manner as one of the nonvolatile memory device 100 of FIG. 1, the nonvolatile memory device 200 of FIG. 8, and the nonvolatile memory device 300 of FIG. 10.

The controller 34 may include a controller core 34_1, a host interface 34_2, and a NAND interface 34_3. The controller core 34_1 may control an overall operation of the MoviNAND™ device 30. The host interface 34_2 may be configured to interface between the controller 34 and an MMC of a host. The NAND interface 34_3 may be configured to interface between the NAND flash memory device 32 and the controller 34.

The MoviNAND™ device 30 may receive power supply voltages Vcc and Vccq from the host. The power supply voltage Vcc (about 3V) may be supplied to the NAND flash memory device 32 and the NAND interface 343, while the power supply voltage Vccq (about 1.8V/3V) may be supplied to the controller 34.

Meanwhile, embodiments of the inventive concept may be applicable to a solid state drive (SSD).

Figure 16:
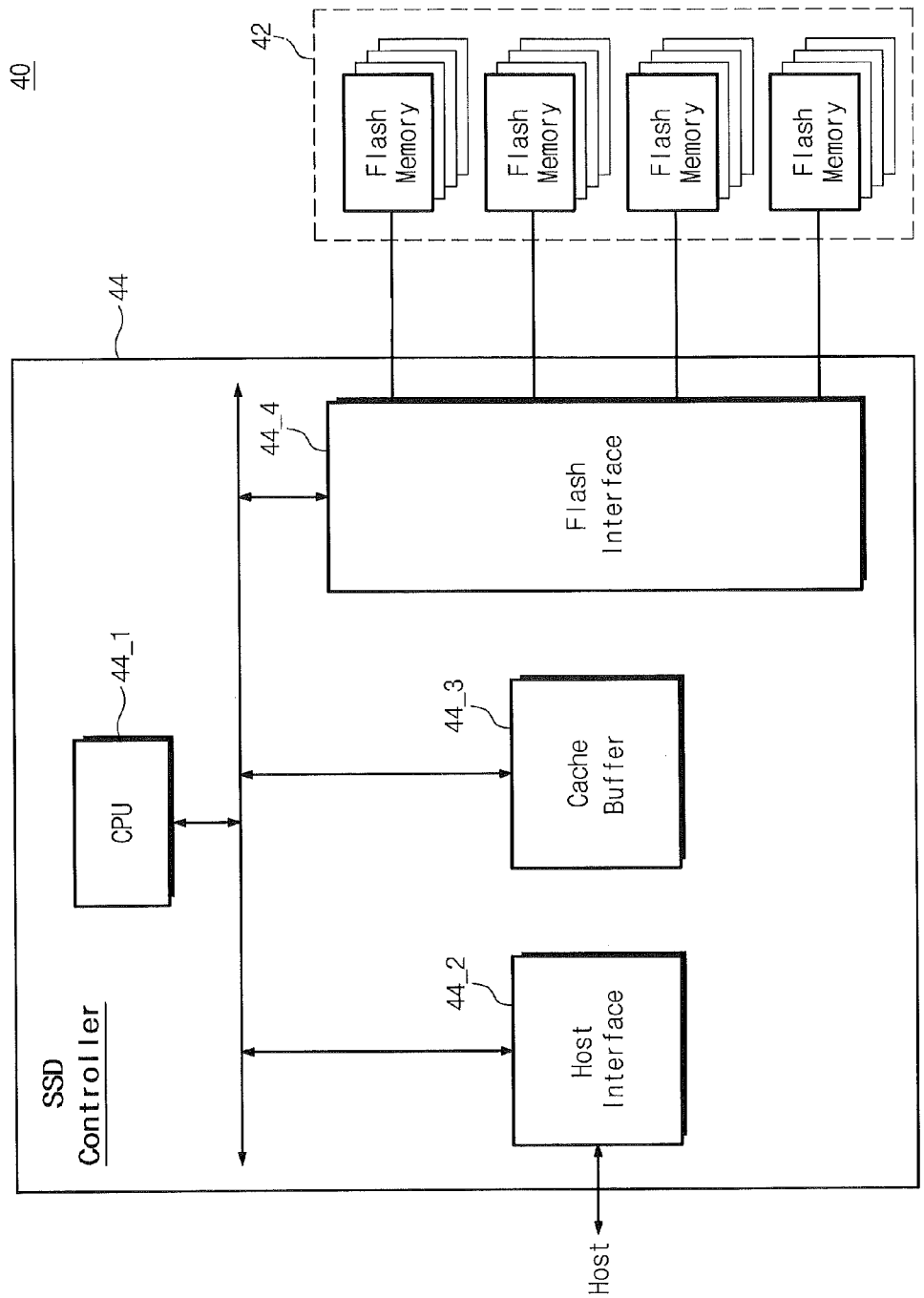
FIG. 16 is a block diagram of an SSD according to some embodiments of the inventive concept.

FIG. 16 is a block diagram of an SSD according to an embodiment of the inventive concept.

Referring to FIG. 16, an SSD 40 may include a plurality of flash memory devices 42 and an SSD controller 44.

Each of the flash memory devices 42 may be implemented in the same manner as one of the nonvolatile memory device 100 of FIG. 1, the nonvolatile memory device 200 of FIG. 8, and the nonvolatile memory device 300 of FIG. 10.

The SSD controller 44 may include a CPU 44_1, a host interface 44_2, a cache buffer 44_3, and a flash interface 44_4.

Under the control of the CPU 44_1, the host interface 44_2 may exchange data with a host through ATA protocol. The host interface 44_2 may be a Serial Advanced Technology Attachment (SATA) interface, a Parallel Advanced Technology Attachment (PATA) interface, and/or an External SATA (ESATA) interface.

Data, which will be received/transmitted from/to the host through the host interface 44_2, may be transferred through the cache buffer 44_3 without passing through a CPU bus, under the control of the CPU 44_1.

The cache buffer 44_3 may temporarily store data transferred between an external device and the flash memory devices 42. The cache buffer 44_3 may also used to store programs that will be executed by the CPU 44_1. The cache buffer 44_3 may be regarded as a kind of buffer memory, and may be implemented using an SRAM.

The flash interface 44_4 may be configured to interface between the SSD controller 44 and the flash memory devices 42 that are used as storage devices. The flash interface 44_4 may be configured to support NAND flash memories, One-NAND flash memories, multi-level flash memories, or single-level flash memories.

Figure 17:
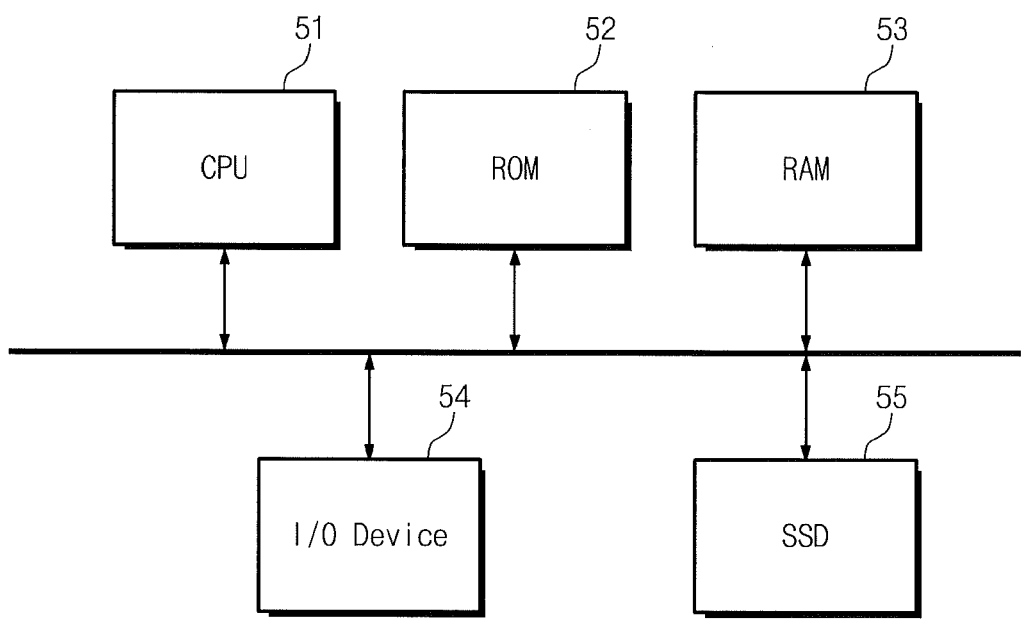
FIG. 17 is a block diagram of a computing system according to some embodiments of the inventive concept.

FIG. 17 is a block diagram of a computing system according to an embodiment of the inventive concept.

Referring to FIG. 17, a computing system 50 may include a CPU 51, a ROM 52, a RAM 53, an input/output (I/O) device 54, and an SSD 55.

The CPU 51 may be connected to a system bus. The ROM 52 may store data used to drive the computing system 50. Herein, the data may include a start command sequence or a basic I/O system (BIOS) sequence. The RAM 53 may temporarily store data that are generated in an operation of the CPU 51.

The I/O device 54 may be connected through an I/O device interface to the system bus. Examples of the I/O device 54 include keyboards, pointing devices (mouse), monitors, and modems.

The SSD 55 may be a readable storage device and may be implemented in the same manner as the SSD 40 of FIG. 16.

Figure 18:
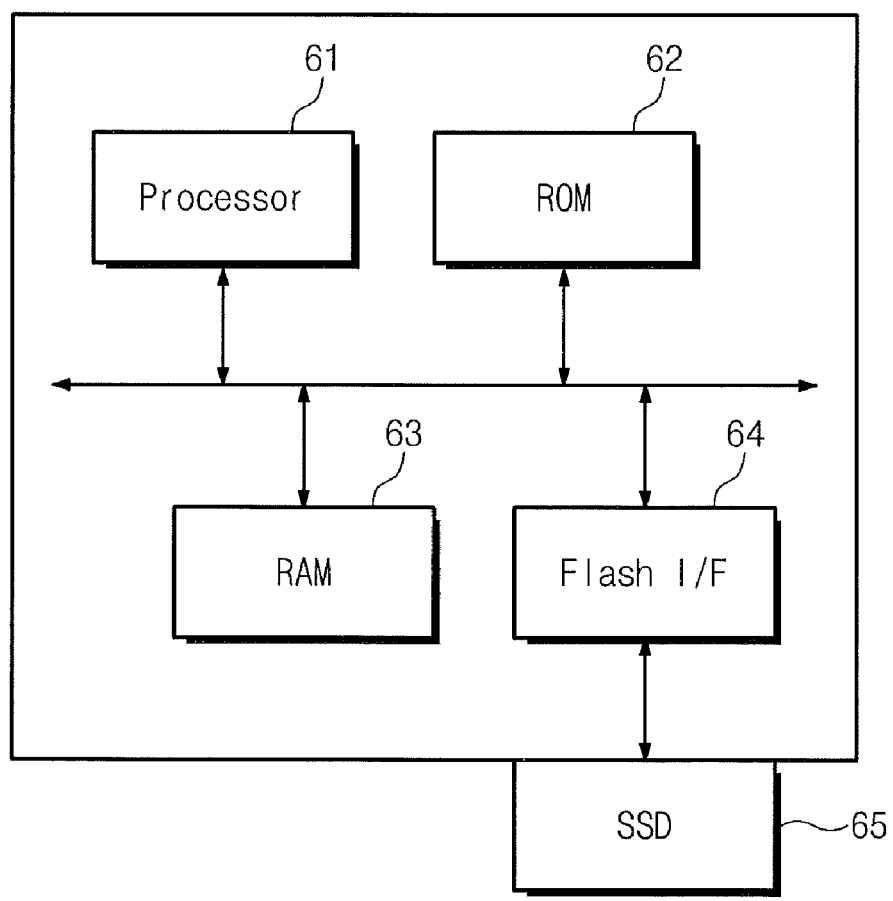
FIG. 18 is a block diagram of an electronic device according to some embodiments of the inventive concept.

FIG. 18 is a block diagram of an electronic device according to an embodiment of the inventive concept.

Referring to FIG. 18, an electronic device 60 may include a processor 61, a ROM 62, a RAM 63, a flash interface (I/F) 64, and an SSD 65.

The processor 61 may access the RAM 63 to execute firmware codes or other necessary codes. Also, the processor 61 may access the ROM 62 to execute various command sequences such as a start command sequence and a basic I/O system (BIOS) sequence. The flash interface 64 may be configured to interface between the electronic device 60 and the SSD 65.

The SSD 65 may be detachable from the electronic device 60. The SSD 65 may be implemented in the same manner as the SSD 40 of FIG. 16.

Examples of the electronic device 60 include cellular phones, personal digital assistants (PDAs), digital cameras, camcorders, portable audio players (e.g., MP3), and portable media players (PMPs).

Figure 19:
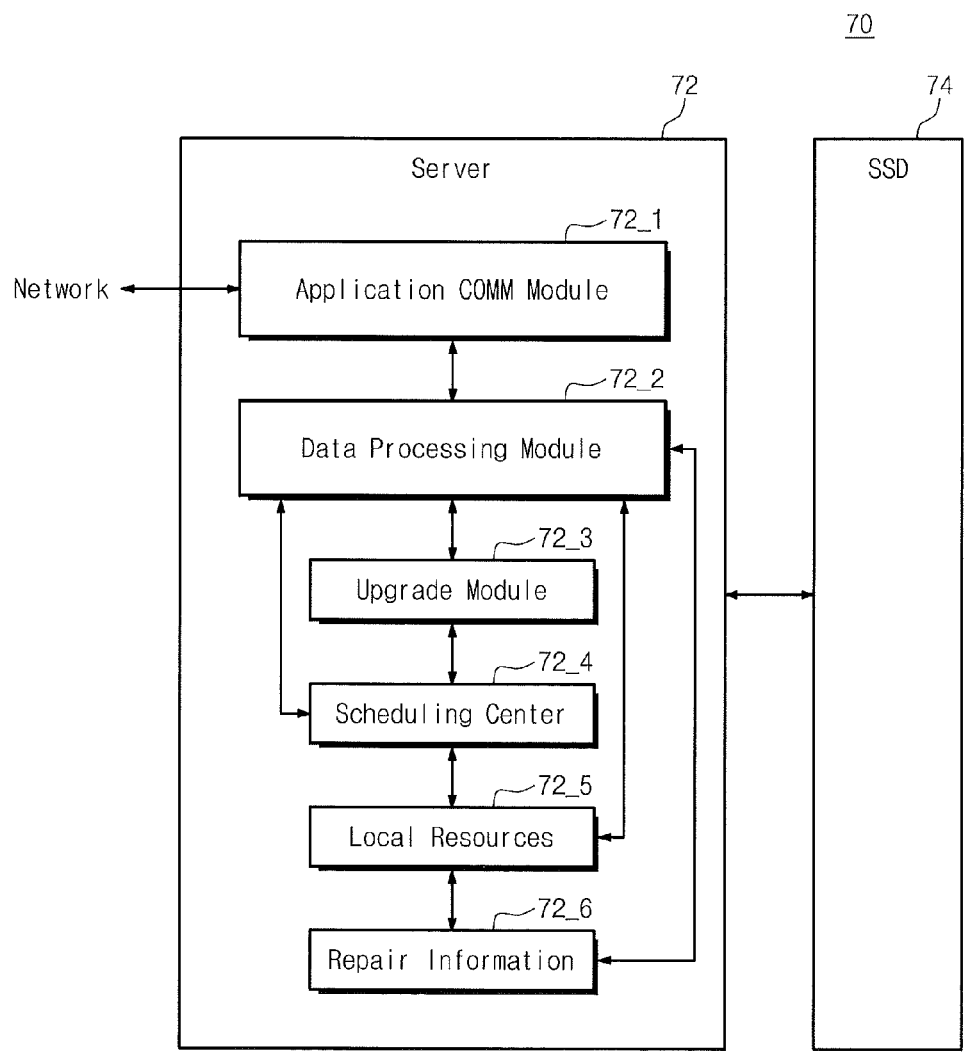
FIG. 19 is a block diagram of a server system according to some embodiments of the inventive concept.

FIG. 19 is a block diagram of a server system according to an embodiment of the inventive concept.

Referring to FIG. 19, a server system 70 may include a server 72 and an SSD 74 that stores data used to drive the server 72. The SSD 74 may be configured in the same manner as the SSD 40 of FIG. 16.

The server 72 may include an application communication module 72_1, a data processing module 72_2, an upgrade module 72_3, a scheduling center 72_4, a local resource module 72_5, and a repair information module 72_6.

The application communication module 72_1 may be configured to communicate with a computing system connected to the server 72 and a network, or to provide communication between the server 72 and the SSD 74. The application communication module 72_1 may transmit information or data, provided through a user interface, to the data processing module 72_2.

The data processing module 72_2 may be linked to the local resource module 72_5. Herein, the local resource module 72_5 may provide a list of repair shops/dealers/technical information to a user on the basis of information or data inputted to the server 72.

The upgrade module 72_3 may interface with the data processing module 72_2. On the basis of information or data received from the SSD 74, the upgrade module 72_3 may upgrade a firmware, a reset code, a diagnosis system, or other information to electronic appliances.

The scheduling center 72_4 may allow real-time options to the user on the basis of information or data inputted to the server 72.

The repair information module 72_6 may interface with the data processing module 72_2. The repair information module 72_6 may be used to provide repair-related information (e.g., audio, video or document files) to the user. The data processing module 72_2 may package related information on the basis of information received from the SSD 74. The packaged information may be transmitted to the SSD 74 or may be displayed to the user.

The memory system or the storage device according to embodiments of the inventive concept may be mounted in various types of packages. Examples of the packages of the memory system or the storage device according to the inventive concept include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the nonvolatile memory devices and the bias voltage applying methods thereof according to the invention concept can reduce the required voltage pumping capacity.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device comprising:
    a first address decoder comprising a plurality of transistors disposed in a first region, wherein the first address decoder is associated with a first memory block;
    a second address decoder comprising a plurality of transistors disposed in a second region that is electrically isolated from the first region, wherein the second address decoder is associated with a second memory block;

a memory cell array including the first and second memory blocks, wherein the memory cell array comprises a plurality of memory cells disposed between the first address decoder and the second address decoder; and a switch circuit comprising a negative voltage line switch circuit configured to provide a negative voltage to one of the first address decoder and the second address decoder based on block address information that specifies an address included in one of the first memory block and the second memory block, wherein the first address decoder comprises a first block selector configured to receive the negative voltage and enable the first memory block based on the block address information, wherein the second address decoder comprises a second block selector configured to receive the negative voltage and enable the second memory block based on the block address information, wherein one of the first block selector and the second block selector is configured to be enabled based on the block address information, and wherein the first block selector comprises:

a first block selection switch configured to drive the first memory block in response to a voltage of a first block word line;

a first pull-up circuit configured to provide a high voltage to the first block word line in response to a first enable signal;

a first pull-down circuit configured to provide the negative voltage to the first block word line in response to a complementary signal of the first enable signal; and a first block address decoder configured to receive the block address information and generate the first enable signal in response thereto.

2. The nonvolatile memory device of claim 1, wherein the switch circuit is configured to provide the negative voltage to one of the first region and the second region based on the address specified by the block address information, and wherein the switch circuit is configured to provide a ground voltage to the second region when the negative voltage is provided to the first region.

3. The nonvolatile memory device of claim 1, further comprising:

a negative voltage level generator configured to generate the negative voltage.

4. The nonvolatile memory device of claim 3, wherein the one of the first address decoder and the second address decoder is configured to provide the negative voltage to at least one word line connected to the one of the first and second memory blocks, and wherein the negative voltage level generator is configured to be enabled when the negative voltage is to be provided to the at least one word line.

5. The nonvolatile memory device of claim 1, wherein the negative voltage line switch circuit is configured to connect the negative voltage with one of a first negative voltage line connected to the first region and a second negative voltage line connected to the second region based on the block address information.

6. The nonvolatile memory device of claim 5, wherein the switch circuit further comprises:

a selection line switch circuit configured to connect a plurality of selection lines to one of first selection lines and second selection lines based on the block address information, wherein the first selection lines are connected to the first address decoder and the second selection lines are connected to the second address decoder.

7. The nonvolatile memory device of claim 6, wherein the selection line switch circuit comprises a plurality of transistors disposed in a region, wherein the selection line switch circuit is configured to connect the negative voltage to at least one of the plurality of selection lines, and wherein, when the negative voltage is provided to the at least one of the selection lines, the negative voltage is provided to the region in which the plurality of transistors of the selection line switch circuit is disposed.

8. The nonvolatile memory device of claim 5, wherein:

the first block selector is configured to receive the negative voltage through the first negative voltage line; and the second block selector is configured to receive the negative voltage through the second negative voltage line.

9. The nonvolatile memory device of claim 1, wherein the second block selector comprises:

a second block selection switch configured to drive the second memory block in response to a voltage of a second block word line;

a second pull-up circuit configured to provide a high voltage to the second block word line in response to a second enable signal;

a second pull-down circuit configured to provide the negative voltage to the second block word line in response to a complementary signal of the second enable signal; and a second block address decoder configured to receive the block address information and generate the second enable signal in response thereto.

10. The nonvolatile memory device of claim 6, further comprising:

a selection line driver configured to drive the plurality of selection lines with a plurality of bias voltages.

11. The nonvolatile memory device of claim 10, wherein the selection line driver comprises a plurality of transistors disposed in a region, and wherein if at least one of the plurality of bias voltages is the negative voltage, the negative voltage is provided to the region in which the plurality of transistors of the selection line driver are disposed.

12. A nonvolatile memory device comprising:

a first matrix of memory cells comprising a plurality of memory blocks;

a second matrix of memory cells comprising a plurality of memory blocks;

a first address decoder associated with the first matrix;

a second address decoder associated with the first matrix;

a third address decoder associated with the second matrix;

a fourth address decoder associated with the second matrix; and a negative voltage line switch circuit configured to connect a negative voltage to one of the first address decoder and the second address decoder, and to one of the third address decoder and the fourth address decoder, based on block address information, wherein the first address decoder comprises a first block selector configured to receive the negative voltage and enable a first one of the memory blocks included in the first matrix based on the block address information, wherein the second address decoder comprises a second block selector configured to receive the negative voltage and enable a second one of the memory blocks included in the first matrix based on the block address information, wherein one of the first block selector and the second block selector is configured to be enabled based on the block address information, and wherein the first block selector comprises:

a first block selection switch configured to drive the first one of the memory blocks of the first matrix in response to a voltage of a first block word line;

a first pull-up circuit configured to provide a high voltage to the first block word line in response to a first enable signal;

a first pull-down circuit configured to provide the negative voltage to the first block word line in response to a complementary signal of the first enable signal; and a first block address decoder configured to receive the block address information and generate the first enable signal in response thereto.

13. The nonvolatile memory device of claim 12, wherein in a 2X mode, the block address information includes a first block address corresponding to one of the plurality of memory blocks included in the first matrix and a second block address corresponding to one of the plurality of memory blocks in the second matrix, and wherein the negative voltage line switch circuit is configured to connect the negative voltage to the one of the first address decoder and the second address decoder associated with the one of the plurality of memory blocks of the first matrix, and to connect the negative voltage to the one of the third address decoder and the fourth address decoder associated with the one of the plurality of memory blocks of the second matrix.

14. The nonvolatile memory device of claim 12, further comprising:

a selection line switch circuit configured to connect a plurality of selection lines to one of first selection lines and second selection lines based on the block address information, wherein the first and second address decoders are disposed on opposite sides of the first matrix, wherein the third and fourth address decoders are disposed on opposite sides of the second matrix, wherein the first selection lines are connected to the first and fourth address decoders, and wherein the second selection lines are connected to the second and third address decoders.

15. The nonvolatile memory device of claim 14, wherein the negative voltage line switch is configured to connect the negative voltage to one of a first negative voltage line that is connected to the first and fourth address decoders and a second negative voltage line that is connected to the second and third address decoders, based on the block address information.

16. A method of operating a nonvolatile memory device including a plurality of address decoders, the method comprising:

generating a negative voltage;

providing the negative voltage to at least one word line of a selected memory block via one of the plurality of address decoders associated therewith in response to a block address, wherein the selected memory block is included in a memory cell array disposed between ones of the address decoders, and wherein the address decoders respectively include a plurality of transistors disposed in an electrically isolated region;

providing the negative voltage to a region of the one of the plurality of address decoders associated with the selected memory block; and providing a ground voltage to a respective region of at least one remaining one of the plurality of address decoders, wherein providing the negative voltage to the at least one word line comprises:

generating a first enable signal or a complementary signal thereof in response the block address;

providing a high voltage to a block word line in response to the first enable signal, wherein the block word line is connected to a block selection switch of the selected memory block;

providing the negative voltage to the block word line in response to the complementary signal of the first enable signal; and driving the at least one word line of the selected memory block in response to a voltage of the block word line.

17. The method of claim 16, further comprising:

providing the negative voltage simultaneously to at least two of the plurality of address decoders.

18. The method of claim 16, further comprising:

selecting a negative voltage line coupled to the region of the one of the plurality of address decoders in response to the block address when providing the negative voltage to the selected memory block, wherein providing the negative voltage to the well comprises providing the negative voltage through the negative voltage line.

* * * * *